United States Patent
Hamada et al.

(10) Patent No.: US 7,606,096 B2
(45) Date of Patent: Oct. 20, 2009

(54) SEMICONDUCTOR INTEGRATED CIRCUIT DEVICE

(75) Inventors: Mototsugu Hamada, Yokohama (JP); TakahirO Hirai, Yokohama (JP); Shiho Nakamura, Fujisawa (JP); Hirofumi Morise, Yokohama (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 11/872,264

(22) Filed: Oct. 15, 2007

(65) Prior Publication Data

US 2008/0298117 A1    Dec. 4, 2008

(30) Foreign Application Priority Data

Oct. 20, 2006    (JP)    ............... 2006-286210

(51) Int. Cl.
*G11C 7/00*    (2006.01)
*G11C 11/00*    (2006.01)
*H03K 3/02*    (2006.01)

(52) U.S. Cl. ............. 365/205; 365/148; 327/51; 327/57; 327/185

(58) Field of Classification Search .......... 365/205
See application file for complete search history.

(56) References Cited

U.S. PATENT DOCUMENTS

| 6,081,153 | A | 6/2000 | Hamada et al. |
| 6,285,575 | B1 * | 9/2001 | Miwa ................ 365/145 |
| 6,785,163 | B2 * | 8/2004 | Yeh et al. ............ 365/185.2 |
| 6,847,543 | B2 * | 1/2005 | Toyoda et al. ........ 365/154 |
| 7,206,217 | B2 | 4/2007 | Ohtsuka et al. |
| 2004/0141363 | A1 * | 7/2004 | Ohtsuka et al. ........ 365/154 |
| 2007/0041242 | A1 * | 2/2007 | Okazaki et al. ........ 365/154 |

FOREIGN PATENT DOCUMENTS

WO    WO 03/085741 A1    10/2003

* cited by examiner

*Primary Examiner*—Son L Mai
(74) *Attorney, Agent, or Firm*—Oblon, Spivak, McClelland, Maier & Neustadt, L.L.P.

(57) ABSTRACT

A semiconductor integrated circuit device, has a first variable resistor element and a second variable resistor element whose resistances are changed complementarily depending on a current; and a current path switching circuit that supplies said current from a power supply by switching between current paths according to whether a normal operation mode or a read mode is input externally, wherein said power supply is turned off and then turned on again in said normal operation mode, and in this state, data corresponding to the relationship between the magnitudes of the resistances of said first variable resistor element and said second variable resistor element is read in said read mode.

12 Claims, 21 Drawing Sheets

SEMICONDUCTOR INTEGRATED CIRCUIT DEVICE

CROSS-REFERENCE TO RELATED APPLICATION

This application is based upon and claims the benefit of priority from the prior Japanese Patent Application No. 2006-286210, filed on Oct. 20, 2006, the entire contents of which are incorporated herein by reference.

BACKGROUND OF THE INVENTION

1. Field of the Invention

The present invention relates to a semiconductor integrated circuit having an SR flip flop circuit.

2. Background Art

With the recent popularization of portable terminals, the demand for a smaller and less power-consuming semiconductor device is growing. Therefore, the importance of non-volatile memories in the portable terminals is also rising.

Non-volatile memories currently in practical use include flash memories and ferroelectric memories. For example, portable terminals, which are required to have a small size, have a non-volatile memory mounted on a silicon device.

Flip flops, which are commonly used in silicon devices, lose the value stored therein when the current supplied thereto is interrupted. Thus, the flip flops require an additional circuit or manipulation to restore the internal state when power is turned on. This leads to a longer time for the flip flops to start operation.

There has been proposed a non-volatile flip flop in which one of a pair of non-volatile variable resistor elements is made to have a higher resistance, and the other is made to have a lower resistance in a storage operation, one of a pair of storage nodes is set at a higher potential, and the other is set at a lower potential according to the difference between the resistances of the pair of non-volatile variable resistor elements in a recall operation, and the pair of non-volatile variable resistor elements are made of a phase change material that has a higher resistance in an amorphous state and has a lower resistance in a crystal state (see Japanese Patent No. 3768504, for example).

In the conventional flip flop, the resistance of the non-volatile variable resistor elements varies with the phase change caused by heating. Therefore, the voltage pulse width applied for heating has to be finely controlled, for example.

SUMMARY OF THE INVENTION

According one aspect of the present invention, there is provided: a semiconductor integrated circuit device, comprising a first variable resistor element and a second variable resistor element whose resistances are changed complementarily depending on a current; and a current path switching circuit that supplies said current from a power supply by switching between current paths according to whether a normal operation mode or a read mode is input externally, wherein said power supply is turned off and then turned on again in said normal operation mode, and in this state, data corresponding to the relationship between the magnitudes of the resistances of said first variable resistor element and said second variable resistor element is read in said read mode.

According another aspect of the present invention, there is provided: a semiconductor integrated circuit device, comprising a sense amplifier circuit that is connected to a power supply, outputs currents from a first current supply terminal and a second current supply terminal, and outputs a first sense signal from a first signal terminal and a second sense signal, which is equivalent to said first sense signal inverted, from a second signal terminal according to a voltage drop due to output of the currents;

a first variable resistor element that is connected to said first current supply terminal of said sense amplifier circuit at a first end, which is one end thereof, and has a resistance that increases when a current of a predetermined value or greater flows in a first direction between said first end and a second end, which is the other end thereof, and decreases when a current of a predetermined value or greater flows in a second direction, which is opposite to said first direction, between said first end and said second end;

a second variable resistor element that is connected to said second current supply terminal of said sense amplifier circuit at a third end, which is one end thereof, and to the second end of said first variable resistor element at a fourth end, which is the other end thereof, and has a resistance that increases when a current of a predetermined value or greater flows in said second between said third end and said fourth end and decreases when a current of a predetermined value or greater flows in said first direction between said third end and said fourth end;

a current path switching circuit that has a first current path extending between a first write path terminal connected to said first end and the ground, a second current path extending between a second write path terminal connected to said third end and said ground, and a third current path extending between a point of connection of said second end and said fourth end and said ground; and an SR flip flop that is connected to said first signal terminal at a first input terminal and to said second signal terminal at a second input terminal and outputs a first output signal from a first output terminal and a second output signal, which is equivalent to said first output signal inverted, from a second output terminal according to the state of the first sense signal and the second sense signal input thereto, wherein said current path switching circuit blocks said third current path and limits one of the current flowing through said first current path and the current flowing through said second current path according to a data signal in a normal operation mode, and blocks said first current path and said second current path and makes said third current path conductive in a read mode, in which data corresponding to the relationship between the magnitudes of the resistances of said first variable resistor element and said second variable resistor element is read after said power supply is turned off and then turned on again in said normal operation mode.

According further aspect of the present invention, there is provided: a semiconductor integrated circuit device, comprising a first variable resistor element that has a resistance that increases when a current of a predetermined value or greater flows in a first direction and decreases when a current of a predetermined value or greater flows in a second direction, which is opposite to said first direction;

a second variable resistor element that has a resistance that increases when a current of a predetermined value or greater flows in said second direction and decreases when a current of a predetermined value or greater flows in said first; and a current path switching circuit that supplies said current to said first variable resistor element and said second variable resistor element from a power supply by switching between current paths connected to said first variable resistor element and said second variable resistor element according to whether a normal operation mode or a read mode, wherein said power supply is turned off and then turned on again in said normal operation mode, and in this state, data corresponding to the relationship between the magnitudes of the resistances of said first variable resistor element and said second variable resistor element is read in said read mode.

DETAILED DESCRIPTION

In the following, embodiments of the present invention will be described with reference to the drawings.

First Embodiment

Figure 1:
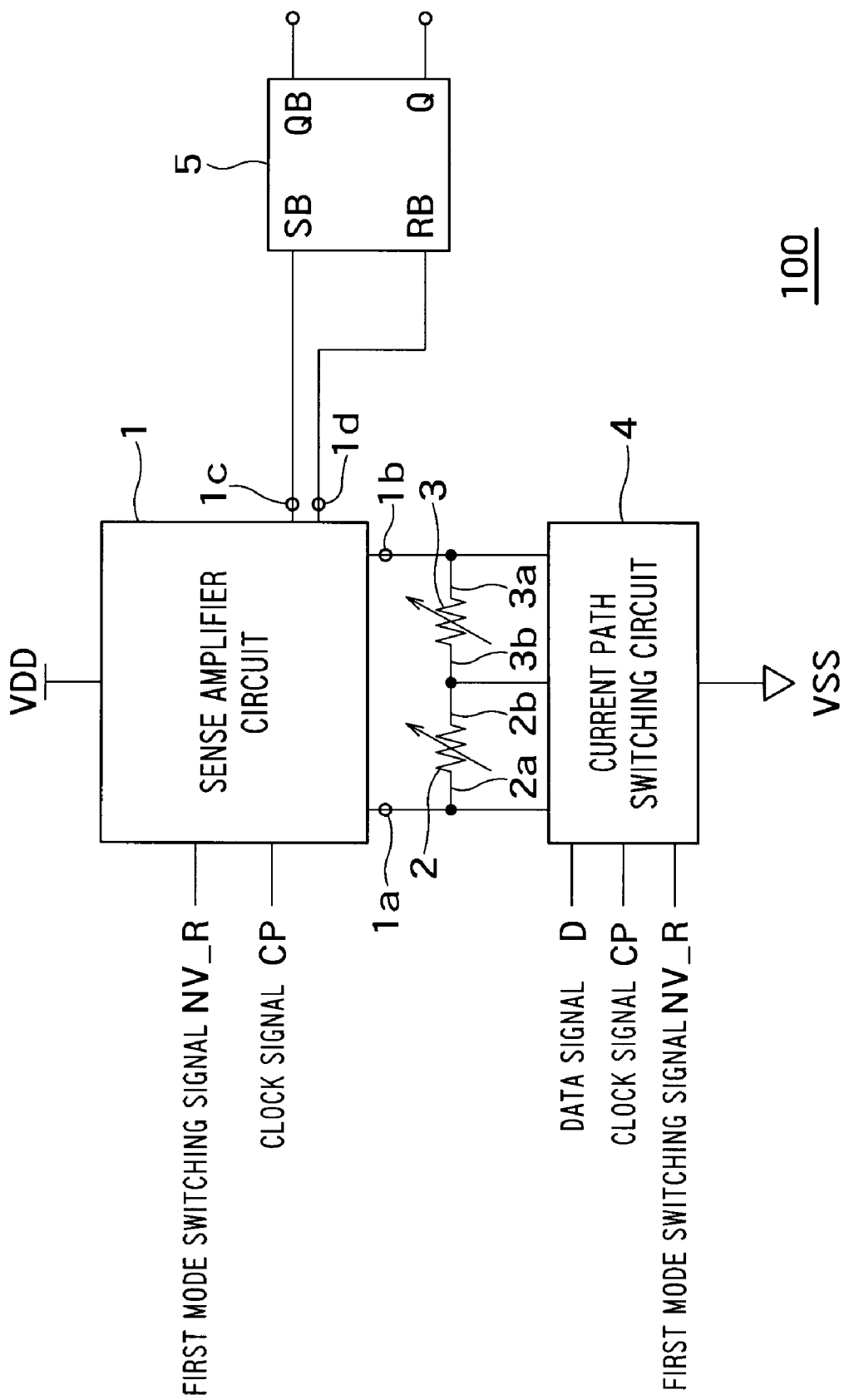
FIG. 1 is a diagram showing a configuration of essential parts of a semiconductor integrated circuit device 100 according to a first embodiment of the present invention.

FIG. 1 is a diagram showing a configuration of essential parts of a semiconductor integrated circuit device 100 according to a first embodiment of the present invention, which is an aspect of the present invention.

As shown in FIG. 1, the semiconductor integrated circuit device 100 has a sense amplifier circuit 1, a first variable resistor element 2, a second variable resistor element 3, a current path switching circuit 4 and an SR flip flop 5.

The sense amplifier circuit 1 is connected to a power supply "VDD" and receives a clock signal "CP" and a first mode switching signal "NV_R". As described later, the first mode switching signal "NV_R" is a signal for switching between a "normal operation mode" in which the semiconductor integrated circuit device functions as a D-type flip flop and a "read mode" in which data corresponding to the relationship between the magnitudes of the resistances of the first variable resistor element 2 and the second variable resistor element 3 is read.

In addition, the sense amplifier circuit 1 outputs currents from a first current supply terminal 1a and a second current supply terminal 1b. According to a voltage drop due to output of the currents, the sense amplifier circuit 1 outputs a first sense signal from a first signal terminal 1c and outputs a second sense signal, which is equivalent to the first sense signal inverted, from a second signal terminal 1d in synchronization with the clock signal "CP" or the first mode switching signal "NV_R".

The first variable resistor element 2 is connected to the first current supply terminal 1a of the sense amplifier circuit 1 at a first end 2a, which is one end thereof.

The resistance of the first variable resistor element 2 increases if a current of a predetermined value or greater flows between the first end 2a and a second end 2b, which is the other end thereof, in a first direction (in the direction from the first end 2a to the second end 2b, or in other words, in the rightward direction, in this example). The resistance of the first variable resistor element 2 decreases if a current of a predetermined value or greater flows therethrough in a second direction opposite to the first direction (in the direction from the second end 2b to the first end 2a, or in other words, in the leftward direction, in this example).

The second variable resistor element 3 is connected to the second current supply terminal 1b of the sense amplifier circuit 1 at a third end 3a, which is one end thereof. The second variable resistor element 3 is connected to the second end 2b of the first variable resistor element 2 at a fourth end 3b, which is the other end thereof.

The resistance of the second variable resistor element 3 increases if a current of a predetermined value or greater flows between the third end 3a and the fourth end 3b in the second direction (in the direction from the third end 3a to the fourth end 3b, or in other words, in the leftward direction, in this example). The resistance of the second variable resistor element 3 decreases if a current of a predetermined value or greater flows therethrough in the first direction (in the direction from the fourth end 3b to the third end 3a, or in other words, in the rightward direction, in this example).

As the first variable resistor element 2 and the second variable resistor element 3, a spin injection device may be used.

(1) In U.S. Pat. No. 5,695,864, for example, there is disclosed that if a current of a critical value or greater flows through the spin injection device for a critical time or longer, magnetization reversal occurs according to the direction of the current. (2) In Appl. Phys. Lett. Vol. 77, pp. 3809 (2000), F. J. Albert et al., for example, there is disclosed that if magnetization reversal occurs, the resistance of the spin injection device varies with the magnetization reversal.

From the facts (1) and (2), there is known a physical phenomenon that, if a current of a predetermined value or greater flows through the spin injection device, the resistance of the spin injection device varies (increases and decreases) according to the direction of the current.

The current path switching circuit 4 has a first current path extending between a first write path terminal 4e connected to the first end 2a and the ground (ground potential "VSS"), a second current path extending between a second write path terminal 4f connected to the third end 3a and the ground (ground potential "VSS"), and a third current path extending between a point of connection of the second end 2b and the fourth end 3b and the ground (ground potential "VSS"). To the current path switching circuit 4, a data signal "D", the clock signal "CP" and the first mode switching signal "NV_R" are input.

The SR flip flop 5 is connected to the first signal terminal 1c at a first input terminal "SB" thereof and to the second signal terminal 1d at a second input terminal "RB" thereof.

The SR flip flop 5 outputs a first output signal from a first output terminal "QB" and outputs a second output signal, which is equivalent to the first output signal inverted, from a second output terminal "Q" according to the state of the first sense signal and the second sense signal input thereto.

According to the present invention, the input/output logic of the SR flip flop 5 can be inverted.

Figure 2:
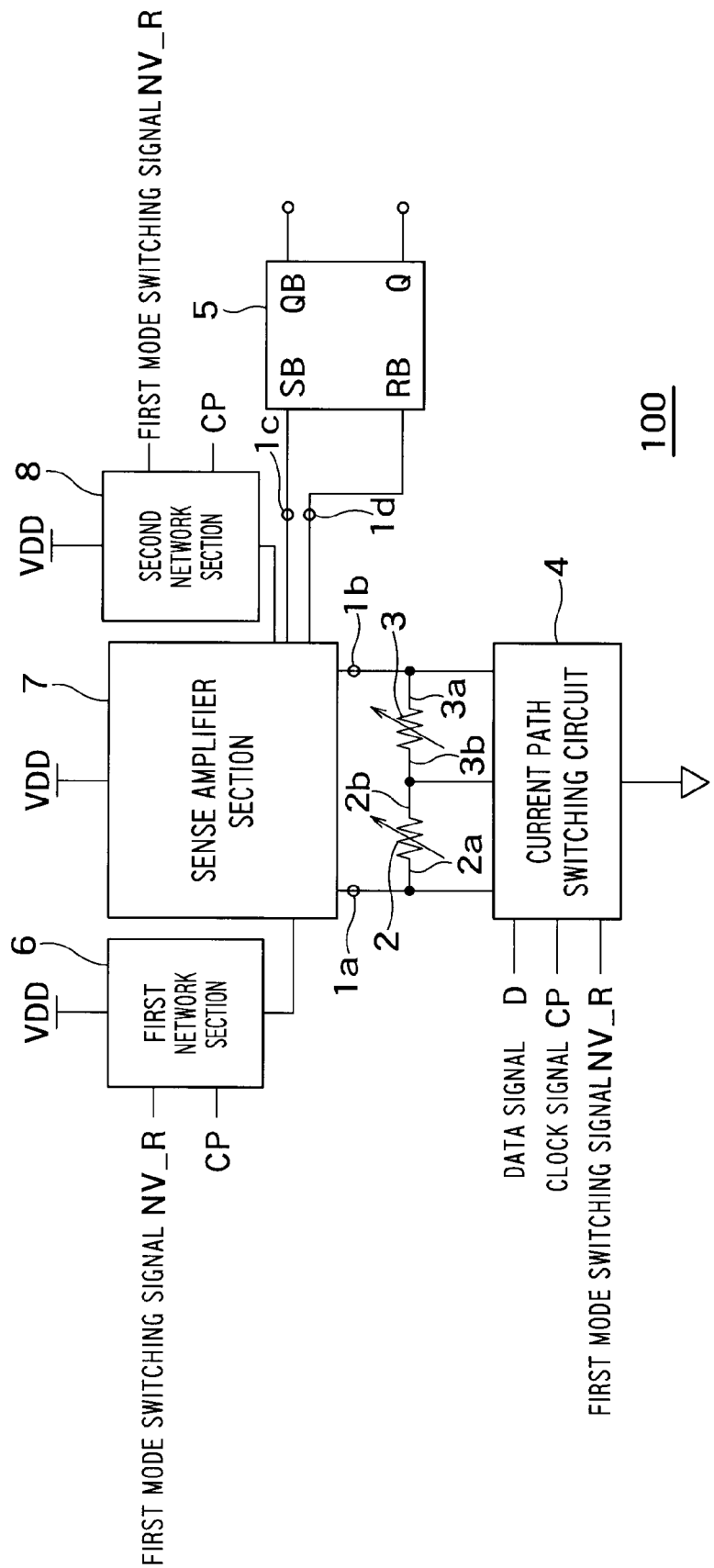
FIG. 2 is a diagram specifically showing the sense amplifier circuit of the semiconductor integrated circuit device shown in FIG. 1.

FIG. 2 is a diagram specifically showing the sense amplifier circuit of the semiconductor integrated circuit device shown in FIG. 1.

As shown in FIG. 2, the sense amplifier circuit 1 has a first network section 6 that outputs a signal in response to the clock signal "CP" or the first mode switching signal "NV_R", a second network section 8 that outputs a signal in response to the clock signal "CP" or the first mode switching signal "NV_R", and a sense amplifier section 7 that outputs the first sense signal and the second sense signal from the first signal terminal 1c and the second signal terminal 1d according to a voltage drop due to output of the currents from the first current supply terminal 1a and the second current supply terminal 1b in synchronization with the output signals of the first network section 6 and the second network section 8.

Figure 3:
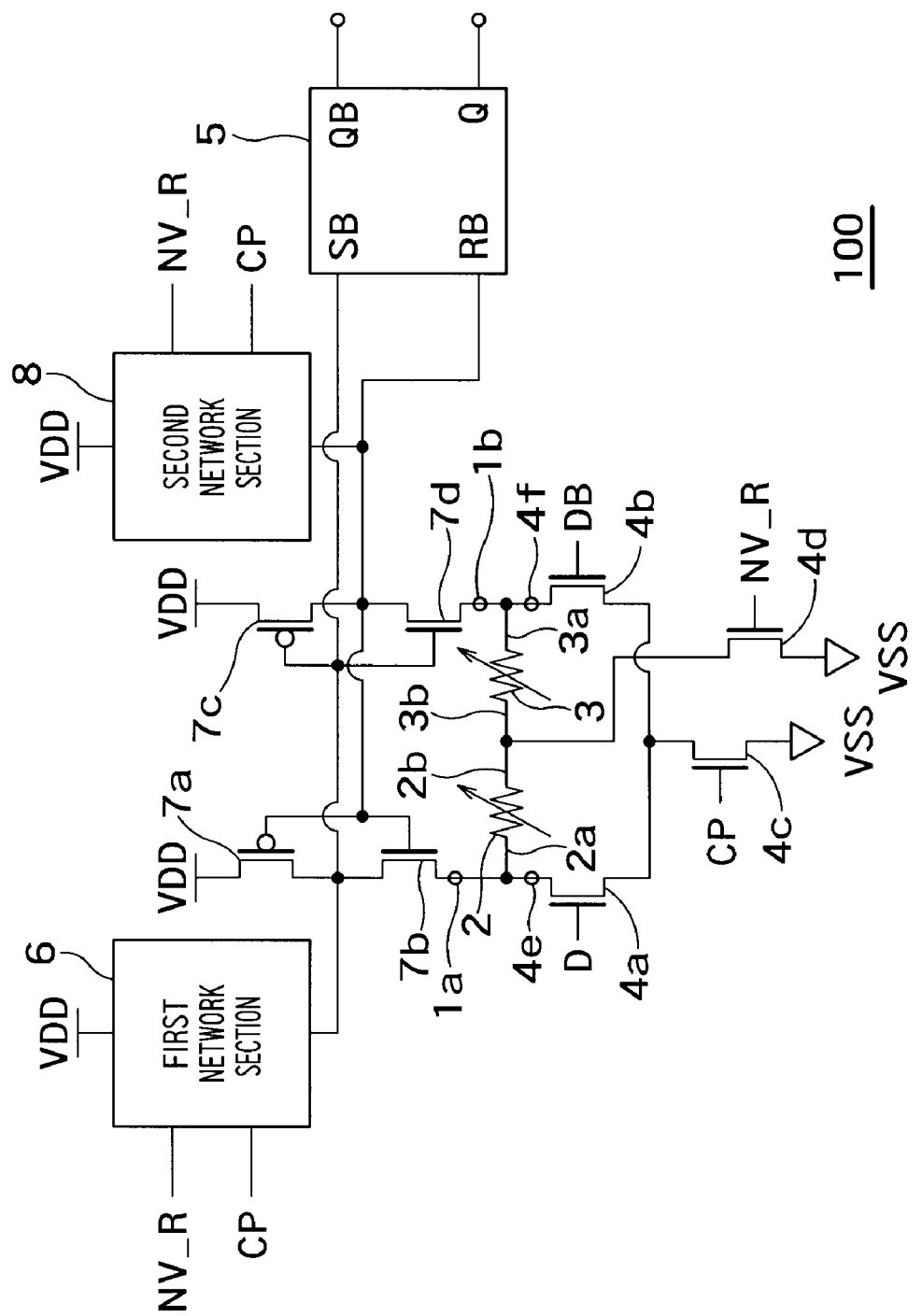
FIG. 3 is a diagram specifically showing an example of the sense amplifier section and the current path switching circuit of the semiconductor integrated circuit device shown in FIG. 2.

FIG. 3 is a diagram specifically showing an example of the sense amplifier section and the current path switching circuit of the semiconductor integrated circuit device shown in FIG. 2.

As shown in FIG. 3, the sense amplifier section 7 has a first p-type MOS transistor 7a connected to a power supply voltage "VDD" at the source thereof, and a first n-type MOS transistor 7b connected to the drain of the first p-type MOS transistor 7a at the drain thereof, to the gate of the first p-type MOS transistor 7a at the gate thereof and to the first end 2a of the first variable resistor element 2 at the source thereof.

The sense amplifier section 7 further has a second p-type MOS transistor 7c connected to the power supply voltage "VDD" at the source thereof, to the drain of the first p-type MOS transistor 7a at the gate thereof and to the gate of the first p-type MOS transistor 7a at the drain thereof, and a second n-type MOS transistor 7d connected to the drain of the second p-type MOS transistor 7c at the drain thereof, to the gate of the second p-type MOS transistor 7c at the gate thereof and to the third end 3a of the second variable resistor element 3 at the source thereof.

The drain of the first p-type MOS transistor 7a is connected to the output of the first network 6 and the first input "SB" of the SR flip flop 5.

The drain of the second p-type MOS transistor 7c is connected to the output of the second network 8 and the second input "RB" of the SR flip flop 5.

As shown in FIG. 3, the current path switching circuit 4 has a third n-type MOS transistor 4a that is connected to the first end 2a of the first variable resistor element 2 at the drain thereof and receives the data signal "D" at the gate thereof, and a fourth n-type MOS transistor 4b that is connected to the third end 3a of the second variable resistor element 3 at the drain thereof and to the source of the third n-type MOS transistor 4a at the source thereof and receives a data signal "DB", which is the data signal "D" inverted", at the gate thereof.

The current path switching circuit 4 further has a fifth n-type MOS transistor 4c that is connected to the sources of the third n-type MOS transistor 4a and the fourth n-type MOS transistor 4b at the drain thereof and to the ground potential at the source thereof and receives the clock signal "CP" at the gate thereof, and a sixth n-type MOS transistor 4d that is connected to the second end 2b of the first variable resistor element 2 and the fourth end 3b of the second variable resistor element 3 at the drain thereof and to the ground potential at the source thereof and receives the first mode switching signal "NV_R" at the gate thereof.

That is, the first current path of the current path switching circuit 4 includes the third n-type MOS transistor 4a. The second current path of the current path switching circuit 4 includes the fourth n-type MOS transistor 4b.

The first and second current paths are blocked by the fifth n-type MOS transistor 4c according to the clock signal "CP". The third current path is blocked by the sixth n-type MOS transistor 4d according to the first mode switching signal "NV_R".

Figure 4:
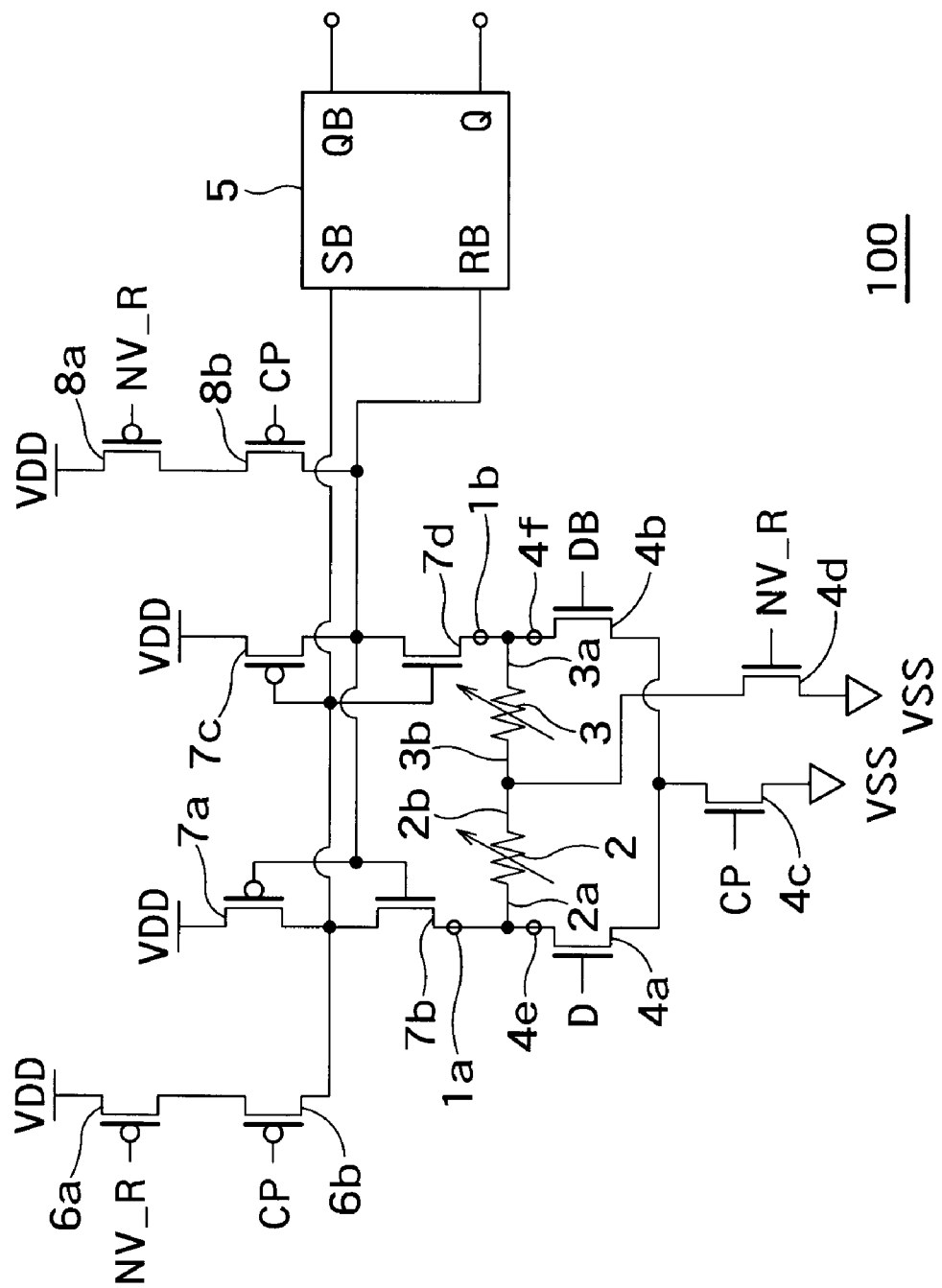
FIG. 4 is a diagram specifically showing the first and second network sections of the semiconductor integrated circuit device shown in FIG. 3.

FIG. 4 is a diagram specifically showing the first and second network sections of the semiconductor integrated circuit device shown in FIG. 3.

As shown in FIG. 4, the first network section 6 has a third p-type MOS transistor 6a that is connected to the power supply voltage "VDD" at the source thereof and receives the first mode switching signal "NV_R" at the gate thereof, and a fourth p-type MOS transistor 6b that is connected to the drain of the third p-type MOS transistor 6a at the source thereof and to the drain of the first p-type MOS transistor 7a at the drain thereof, which constitutes the output of the first network section 6, and receives the clock signal "CP" at the gate thereof.

As shown in FIG. 4, the second network section 8 has a fifth p-type MOS transistor 8a that is connected to the power supply voltage "VDD" at the source thereof and receives the first mode switching signal "NV_R" at the gate thereof, and a sixth p-type MOS transistor 8b that is connected to the drain of the fifth p-type MOS transistor 8a at the source thereof and to the drain of the second p-type MOS transistor 7c at the drain thereof, which constitutes the output of the second network section 8, and receives the clock signal "CP" at the gate thereof.

Figure 5:
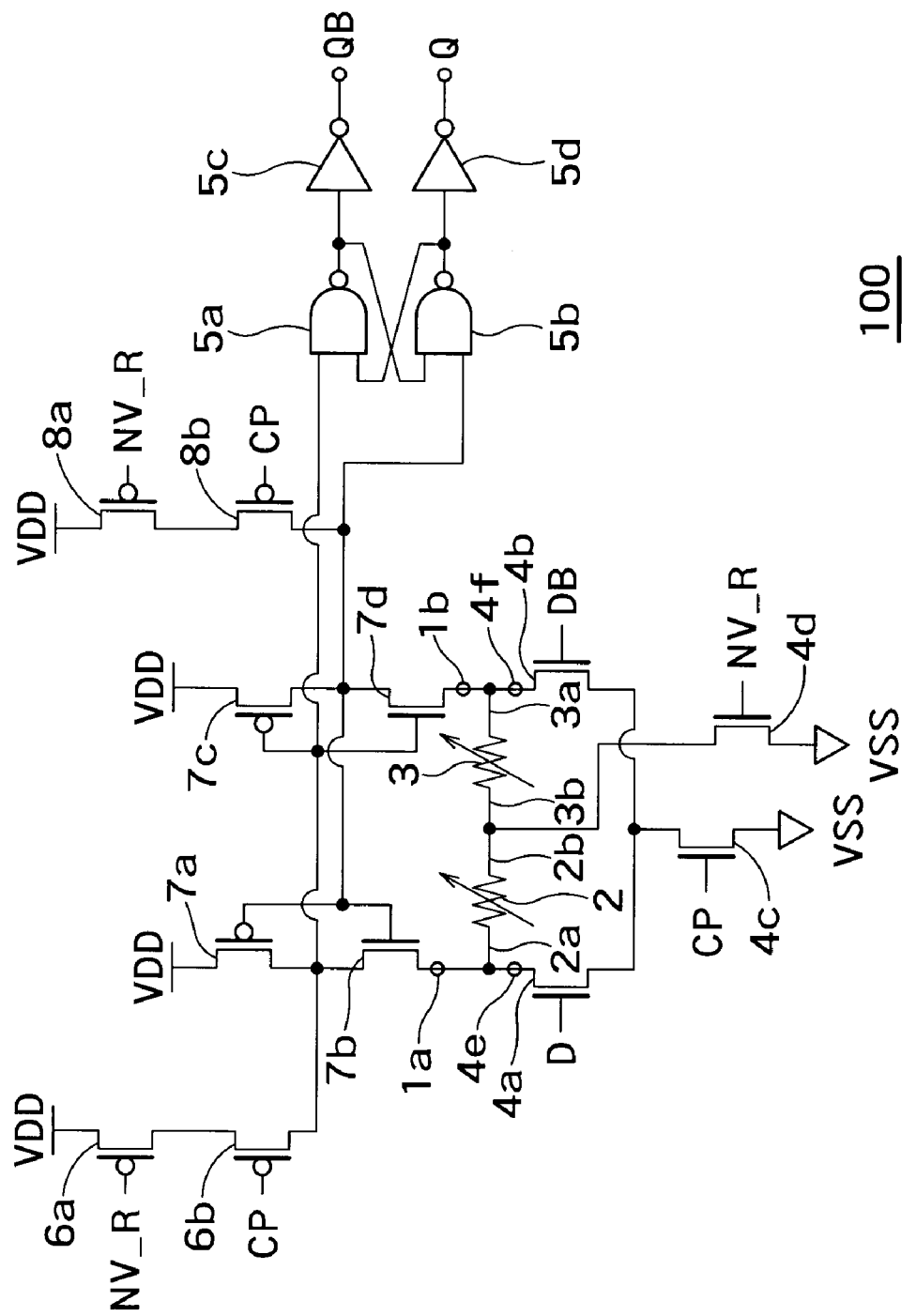
FIG. 5 is a diagram specifically showing the SR flip flop of the semiconductor integrated circuit device shown in FIG. 4.

FIG. 5 is a diagram specifically showing the SR flip flop of the semiconductor integrated circuit device shown in FIG. 4.

As shown in FIG. 5, the SR flip flop 5 has a first NAND circuit 5a connected to the drain of the first p-type MOS transistor 7a at an input thereof that constitutes the first input "SB", and a second NAND circuit 5b that is connected to the drain of the second p-type MOS transistor 7c and the output of the first NAND circuit 5a at different inputs thereof and connected to another input of the first NAND circuit 5a at the output thereof.

The SR flip flop 5 further has a first inverter 5c that is connected to the output of the first NAND circuit 5a at the input thereof and outputs the first output signal and a second inverter 5d that is connected to the output of the second NAND circuit 5b at the input thereof and outputs the second output signal, which is equivalent to the first output signal inverted.

One of the inputs of the first NAND circuit 5a constitutes the first input "SB" of the SR flip flop 5.

One of the inputs of the second NAND circuit 5b constitutes the second input "RB" of the SR flip flop 5.

Now, there will be described an operation in which power supply to the semiconductor integrated circuit device 100 configured as described above is temporarily stopped when the semiconductor integrated circuit device 100 is operating normally, and then power supply is resumed to output retained data.

Figure 6:
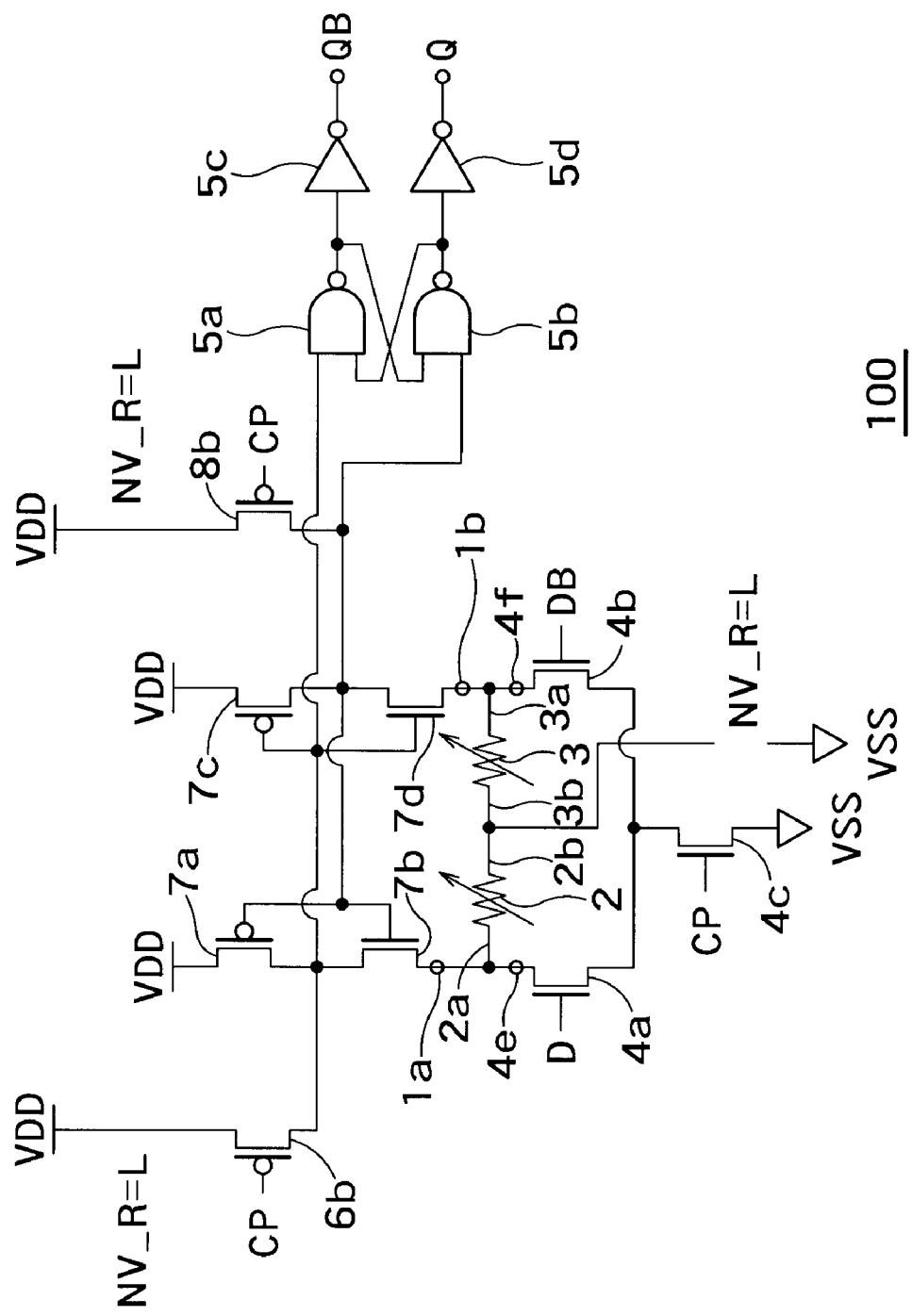
FIG. 6 is a diagram for illustrating a case where the semiconductor integrated circuit device 100 shown in FIG. 5 is in a normal operation mode (a case where the input first mode switching signal "NV_R" is "Low")

FIG. 6 is a diagram for illustrating a case where the semiconductor integrated circuit device 100 shown in FIG. 5 is in a normal operation mode (a case where the input first mode switching signal "NV_R" is "Low"). In FIG. 6, nonconductive MOS transistors are not shown (the same holds true for the following description).

When the semiconductor integrated circuit device 100 shown in FIG. 5 is in the normal operation mode, that is, when the first mode switching signal "NV_R" is "Low", the semiconductor integrated circuit device 100 has a circuit configuration shown in FIG. 6. As shown in FIG. 6, since the first mode switching signal "NV_R" is "Low", the sixth n-type MOS transistor 4d is turned off, and the current path switching circuit 4 blocks the third current path. Furthermore, the current path switching circuit 4 controls the on/off state of the third n-type MOS transistor 4a and the fourth n-type MOS transistor 4b according to the data signal "D" and the data signal "DB" equivalent to the data signal "D" inverted, thereby limiting one of the current flowing through the first current path and the current flowing through the second current path.

Thus, in the normal operation mode, the whole of the semiconductor integrated circuit device 100 operates in the same manner as a D-type flip flop (F/F).

In the normal operation mode, the direction of the current flowing through the first variable resistor element 2 and the second variable resistor element 3 differs according to whether the data signal "D" is "High" or "Low".

As described above, for example, the first variable resistor element 2 has a lower resistance when the current flows in the leftward direction and has a higher resistance when the current flows through the rightward.

On the other hand, the second variable resistor element 3 has a higher resistance when the current flows in the leftward direction and has a lower resistance when the current flows through the rightward.

With such a circuit configuration, for example, if the data signal "D" is "High", and the clock signal "CP" changes from "low" to "High", a current flows through the first variable resistor element 2 and the second variable resistor element 3 in the leftward direction. In this case, the first variable resistor element 2 has a lower resistance, and the second variable resistor element 3 has a higher resistance.

Then, in this state, power supply from the power supply "VDD" to the semiconductor integrated circuit device 100 is stopped. As a result, charges on all the nodes in the semiconductor integrated circuit device 100 are discharged. Therefore, the internal condition defined by those charges is not retained. However, since a current of a predetermined value or greater does not flow if power supply from the power supply "VDD" is stopped, the relationship between the magnitudes of the resistances of the first variable resistor element 2 and the second variable resistor element 3 is maintained.

After power supply from the power supply "VDD" is stopped, power supply from the power supply "VDD" to the semiconductor integrated circuit device 100 is resumed to activate the semiconductor integrated circuit device 100. At this time, the clock signal "CP" is fixed at the "Low" state.

Now, there will be described an operation in the read mode in which data retained in the first variable resistor element 2 and the second variable resistor element 3 (data corresponding to the relationship between the magnitudes of the resistances thereof) is read into the SR flip flop 5 (an operation at the time when the first mode switching signal "NV_R" is changed from "Low" to "High").

The "read mode" described above refers to a mode in which the power supply "VDD" is turned off and then turned on again in the normal operation mode, and in this state, data corresponding to the relationship between the magnitudes of the resistances of the first variable resistor element 2 and the second variable resistor element 3 is read into the SR flip flop 5. In the read mode, the first mode switching signal "NV_R" is "High".

In this way, in the read mode, the current path switching circuit 4 blocks the first and second current paths and makes the third current path conductive.

Figure 7:
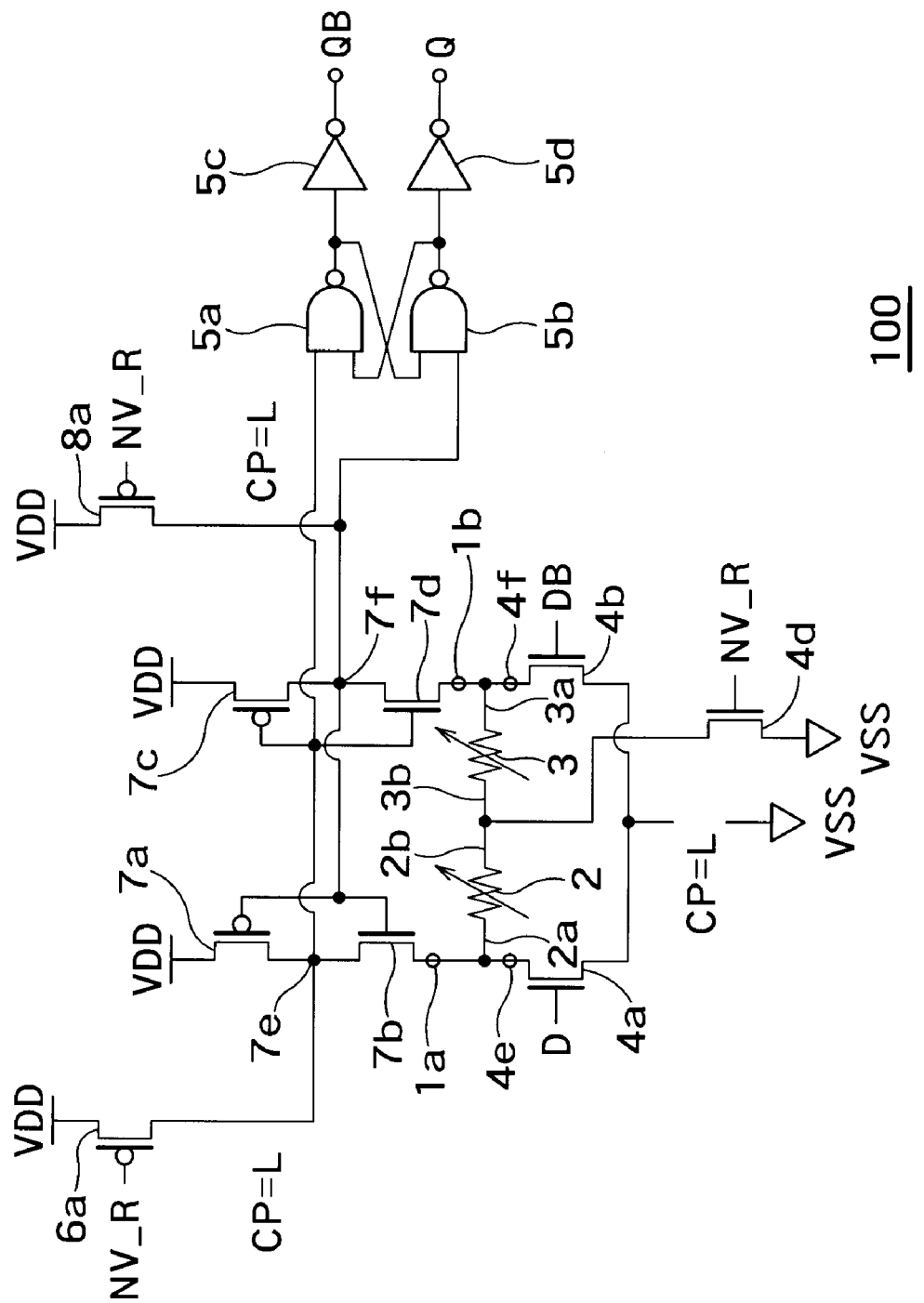
FIG. 7 is a diagram for illustrating an operation of the semiconductor integrated circuit device 100 shown in FIG. 5 to read data retained in the first variable resistor element and the second variable resistor element into the SR flip flop.

FIG. 7 is a diagram for illustrating an operation of the semiconductor integrated circuit device 100 shown in FIG. 5 to read data retained in the first variable resistor element 2 and the second variable resistor element 3 into the SR flip flop 5. In FIG. 7, as described above, the clock signal "CP" is fixed at the "Low" state.

When power supply from the power supply "VDD" to the semiconductor integrated circuit device 100 is resumed, the first variable resistor element 2 has a lower resistance, and the second variable resistor element 3 has a higher resistance. Therefore, if the first mode switching signal "NV_R" changes from "Low" to "High", the potential at a first node 7e decreases earlier than that at a second node 7f. When the potential at the first node 7e decreases to a potential that causes turn-on of the second p-type MOS transistor 7c, the potential at the second node 7f is restored to the power supply voltage. As a result, after a lapse of a certain time, the potentials (potential values) at the first node 7e and the second node 7f are read into the SR flip flop 5.

In this case, since the potential at the first node 7e is "Low", the second output terminal "Q" is in the "High" state, and the first output terminal "QB" is in the "Low" state. The states of the first output terminal "QB" and the second output terminal "Q" are the same as those in the case where the data signal "D" is "High". Thus, even after the power supply "VDD" is turned off, the semiconductor integrated circuit device 100 retains the values at the time when the data signal "D" is "High". In other words, the semiconductor integrated circuit device 100 operates as a non-volatile flip flop.

Then, the first mode switching signal "NV_R" is changed from "High" to "Low", and the clock signal "CP" fixed at "Low" is restored to a normal variable state. As a result, the semiconductor integrated circuit device 100 returns to the normal operation mode described above and operates as a D-type flip flop.

As described above, the semiconductor integrated circuit device according to this embodiment can be readily made to operate as a non-volatile flip flop.

Second Embodiment

In the first embodiment, there has been described a configuration in which, in the normal operation mode, a current of a predetermined value or greater flows through the first and second variable resistor elements to change the resistances thereof.

In the second embodiment, there will be described a configuration in which current supply circuits supply an additional current to make a current of a predetermined value or greater flow through a first variable resistor element and a second variable resistor element with higher reliability.

Figure 8:
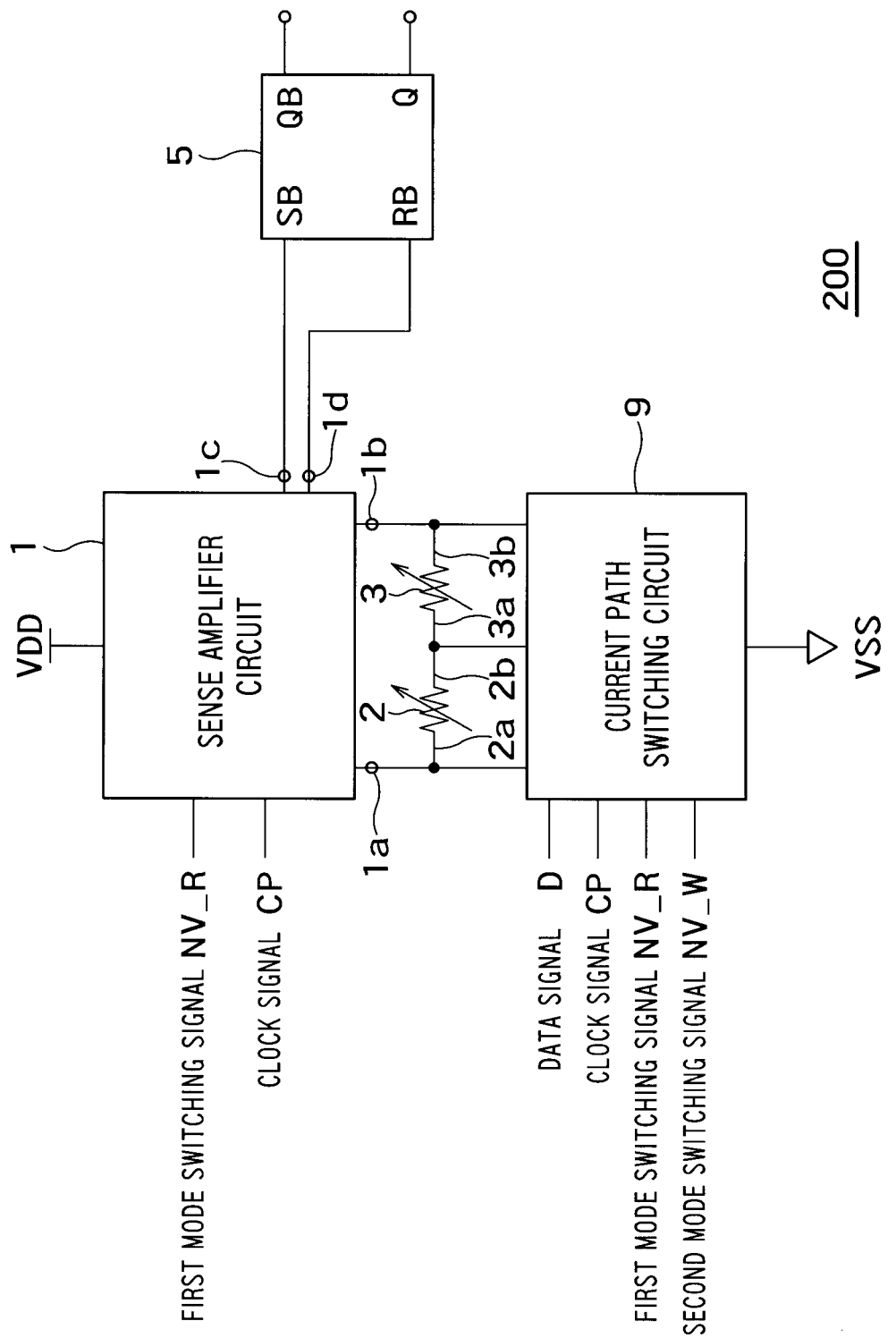
FIG. 8 is a diagram showing a configuration of essential parts of a semiconductor integrated circuit device 200 according to a second embodiment of the present invention.

FIG. 8 is a diagram showing a configuration of essential parts of a semiconductor integrated circuit device 200 according to the second embodiment of the present invention, which is an aspect of the present invention. In FIG. 8, the same reference numerals as those in FIG. 1 denote the same parts as those in the first embodiment.

As shown in FIG. 8, the semiconductor integrated circuit device 200 has a sense amplifier circuit 1, a first variable resistor element 2, a second variable resistor element 3, a current path switching circuit 9, and an SR flip flop 5. The parts other than the current path switching circuit 9 are the same as those in the first embodiment.

The current path switching circuit 9 has a first current path extending between a first write path terminal 4e connected to a first end 2a and the ground (ground potential "VSS"), a second current path extending between a second write path terminal 4f connected to a third end 3a and the ground (ground potential "VSS"), and a third current path extending between a point of connection of a second end 2b and a fourth end 3b and the ground (ground potential "VSS").

To the current path switching circuit 9, a data signal "D", a clock signal "CP", a first mode switching signal "NV_R" and a second mode switching signal "NV_W" are input.

As described later, the second mode switching signal "NV_W" is a signal to indicate whether to supply an additional current to the first variable resistor element 2 and the second variable resistor element 3 to flow a current of a predetermined value or greater through the first variable resistor element 2 and the second variable resistor element 3 (that is, to increase or decrease the resistances thereof) in a "normal operation mode".

Figure 9:
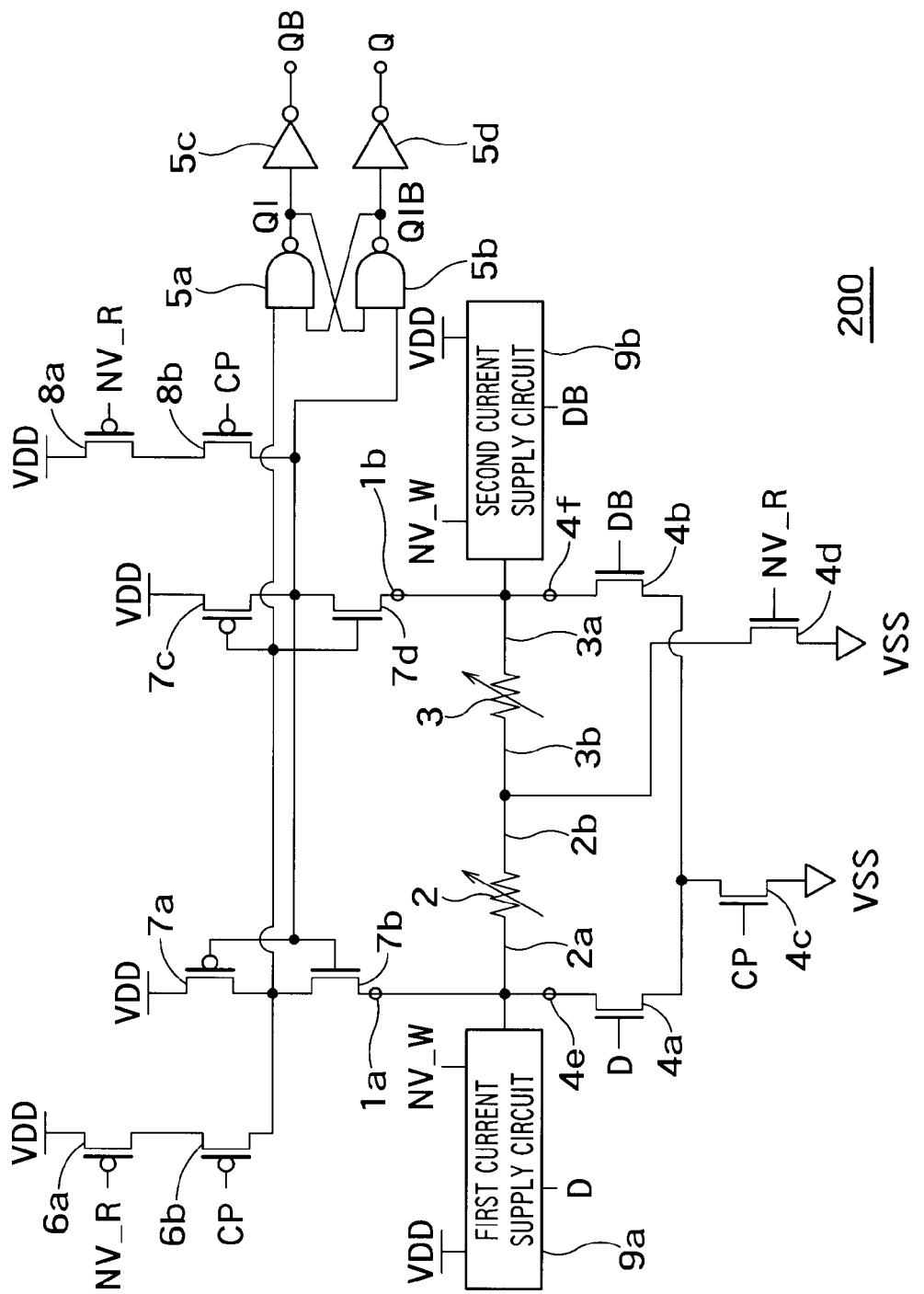
FIG. 9 is a diagram specifically showing the components of the semiconductor integrated circuit device shown in FIG. 8 including the current path switching circuit.

FIG. 9 is a diagram specifically showing the components of the semiconductor integrated circuit device shown in FIG. 8 including the current path switching circuit. In FIG. 9, the same reference numerals as those in FIG. 5 denote the same parts as those in the first embodiment.

As shown in FIG. 9, the current path switching circuit 9 described above has a third n-type MOS transistor 4a that is connected to the first end 2a of the first variable resistor element 2 at the drain thereof and receives the data signal "D" at the gate thereof, and a fourth n-type MOS transistor 4b that is connected to the third end 3a of the second variable resistor element 3 at the drain thereof and to the source of the third n-type MOS transistor 4a at the source thereof and receives a data signal "DB" at the gate thereof.

The current path switching circuit 9 further has a fifth n-type MOS transistor 4c that is connected to the sources of the third n-type MOS transistor 4a and the fourth n-type MOS transistor 4b at the drain thereof and to the ground potential at the source thereof and receives the clock signal "CP" at the gate thereof, and a sixth n-type MOS transistor 4d that is connected to the second end 2b of the first variable resistor element 2 and the fourth end 3b of the second variable resistor element 3 at the drain thereof and to the ground potential at the source thereof and receives the first mode switching signal "NV_R" at the gate thereof.

That is, the first current path of the current path switching circuit 9 includes the third n-type MOS transistor 4a. The second current path of the current path switching circuit 9 includes the fourth n-type MOS transistor 4b.

The first and second current paths are blocked by the fifth n-type MOS transistor 4c according to the clock signal "CP". The third current path is blocked by the sixth n-type MOS transistor 4d according to the first mode switching signal "NV_R".

The current path switching circuit 9 further has a first current supply circuit 9a connected between a power supply "VDD" and the first end 2a, and a second current supply circuit 9b connected between the power supply "VDD" and the third end 3a.

Figure 10:
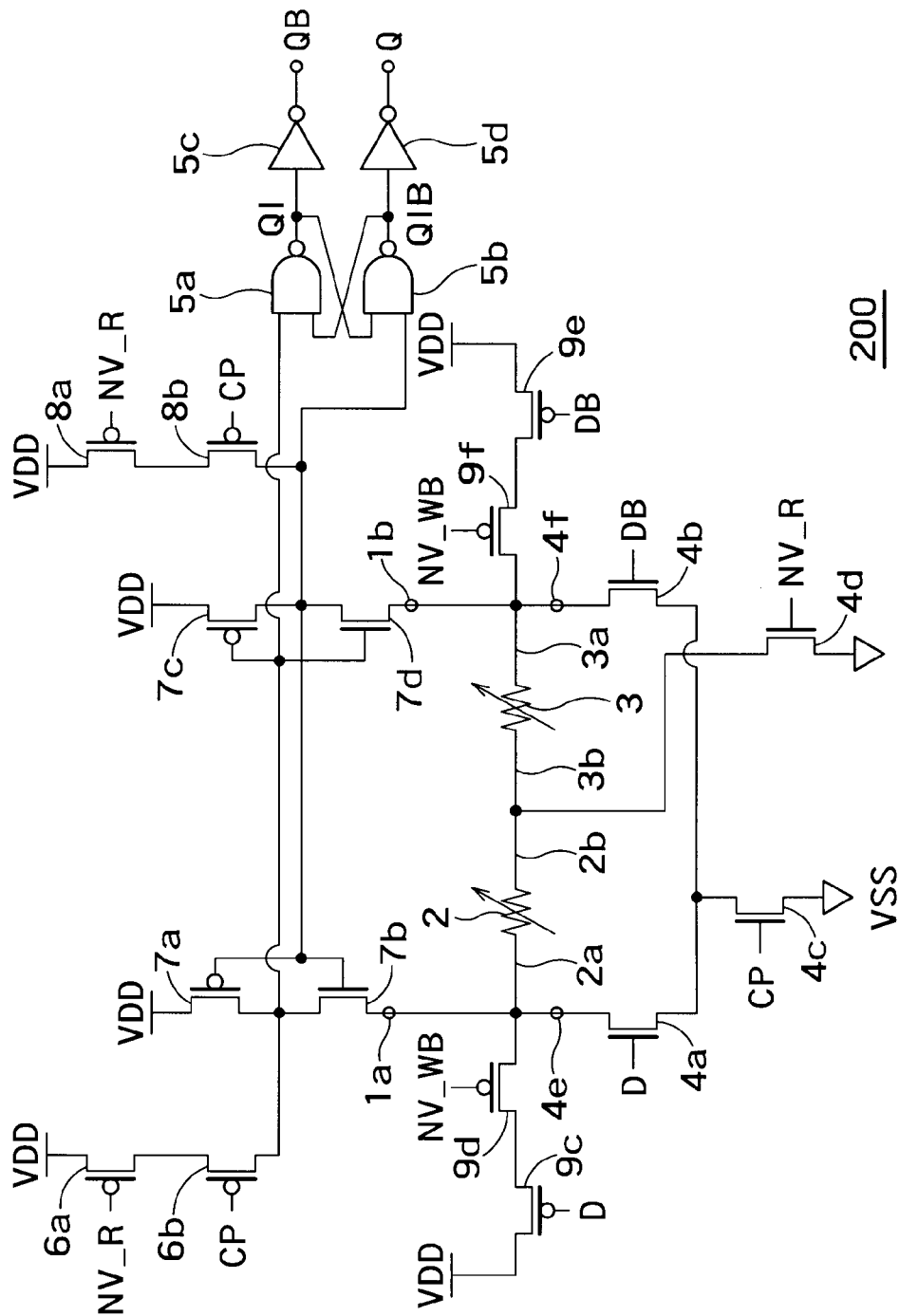
FIG. 10 is a diagram specifically showing the first and second current supply circuits of the semiconductor integrated circuit device shown in FIG. 9.

FIG. 10 is a diagram specifically showing the first and second current supply circuits of the semiconductor integrated circuit device shown in FIG. 9. In FIG. 10, the same reference numerals as those in FIG. 5 denote the same parts as those in the first embodiment.

As shown in FIG. 10, the first current supply circuit 9a has a seventh p-type MOS transistor 9c that is connected to the power supply "VDD" at the source thereof and receives the data signal "D" at the gate thereof, and an eighth p-type MOS transistor 9d that is connected to the drain of the seventh p-type MOS transistor 9c at the source thereof and to the first end 2a at the drain thereof and receives a signal "NV_WB", which is equivalent to the second mode switching signal "NV_W" inverted, at the gate thereof.

The second current supply circuit 9b has a ninth p-type MOS transistor 9e that is connected to the power supply "VDD" at the source thereof and receives the data signal "DB" at the gate thereof, and a tenth p-type MOS transistor 9f that is connected to the drain of the ninth p-type MOS transistor 9e at the source thereof and to the third end 3a at the drain thereof and receives the signal "NV_WB" at the gate thereof.

The signal "NV_WB" is generated by a circuit not shown based on the second mode switching signal "NV_W", for example.

Now, there will be described an operation of the semiconductor integrated circuit device 200 configured as described above to retain data in the first variable resistor element 2 and the second variable resistor element 3 with higher reliability in the normal operation mode.

The operation of the semiconductor integrated circuit device 200 at the time when the signal "NV_WB" is "High" (the second mode switching signal "NV_W" is "Low") in the normal operation mode is the same as the operation of the semiconductor integrated circuit device 100 according to the first embodiment shown in FIG. 5 in the normal operation mode. In other words, the semiconductor integrated circuit device operates as a D-type flip flop.

Thus, there will be described an operation in the case where the signal "NV_WB" is "Low" (the second mode switching signal "NV_W" is "High"). The clock signal "CP" is fixed at "Low", and the first mode switching signal "NV_R" is fixed at "Low".

If the signal "NV_WB" is "Low", a current flows through the spin-injection variable resistor elements according to the data signals "D" and "DB". For example, if the data signal "D" is "High", a current flows in the leftward direction. The amount and duration of the current can be controlled by adjusting the size of the eighth p-type MOS transistor 9d and the tenth p-type MOS transistor 9f and the time in which the signal "NV_WB" is kept at "Low". At this time, as in the first embodiment described above, the first variable resistor element 2 has a lower resistance, and the second variable resistor element 3 has a higher resistance.

Then, the power supply "VDD" is turned off and then turned on again. After that, in the state where the signal "NV_WB" is "High" (the second mode switching signal "NV_W" is "Low"), as in the first embodiment, data based on the relationship between the magnitudes of the resistances of the first variable resistor element 2 and the second variable resistor element 3 is read into the SR flip flop 5.

In this way, in the normal operation mode, the first current supply circuit 9a and the second current supply circuit 9b supply a current to the first variable resistor element 2 and the second variable resistor element 3 so that a current of a predetermined value or greater flows through the first variable resistor element 2 and the second variable resistor element 3 according to the second mode switching signal "NV_W" and the data signal "D".

In this way, a current of a predetermined value or greater can be flowed through the first variable resistor element 2 and the second variable resistor element 3 with higher reliability. Therefore, data recording in the first variable resistor element 2 and the second variable resistor element 3 based on the relationship between the magnitudes of the resistances can be achieved with higher reliability.

As described above, the first current path includes the third n-type MOS transistor 4a that limits the current under control of the data signal, and the second current path includes the fourth n-type MOS transistor 4b that limits the current under the control of the data signal. When these MOS transistors are in the on state, the MOS transistors add a parasitic capacitance to the first variable resistor element 2 and the second variable resistor element 3. The parasitic capacitance can reduce the accuracy of the operation in the read mode.

Now, there will be described a modification of the semiconductor integrated circuit device 200 configured for reducing the parasitic capacitance.

Figure 11:
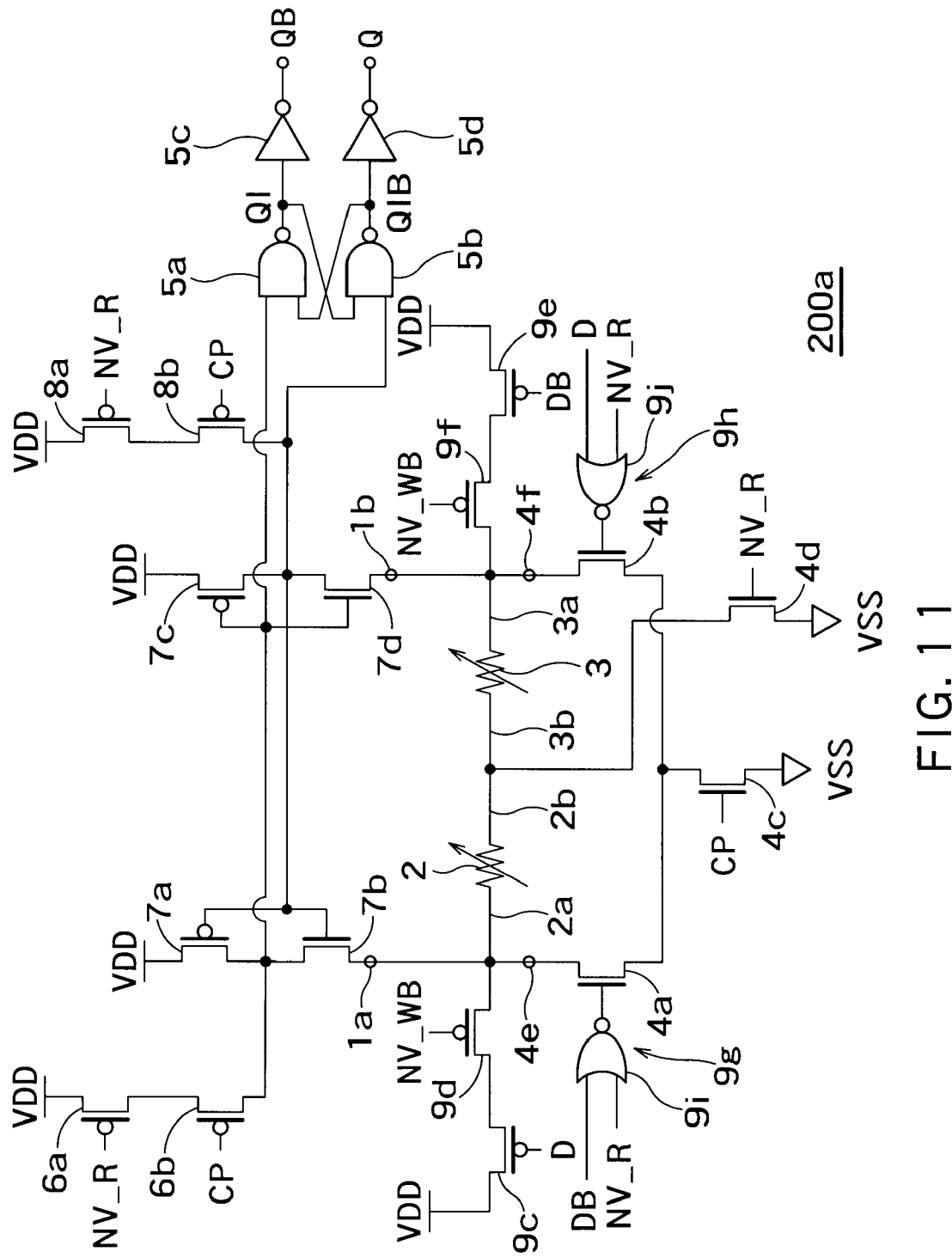
FIG. 11 is a diagram showing a modification of the semiconductor integrated circuit device shown in FIG. 10.

FIG. 11 is a diagram showing a modification of the semiconductor integrated circuit device shown in FIG. 10. In FIG. 11, the same reference numerals as those in FIG. 10 denote the same parts as those in FIG. 10.

As shown in FIG. 11, in a semiconductor integrated circuit device 200a, the current path switching circuit 9 further has a first control circuit 9g that turns off the third n-type MOS transistor 4a in the read mode, and a second control circuit 9h that turns off the fourth n-type MOS transistor 4b in the read mode.

For example, the first control circuit 9g is constituted by a first NOR circuit 9i that receives the data signal "DB" and the first mode switching signal "NV_R", performs an arithmetic operation thereon and outputs the result of the arithmetic operation to the gate of the third n-type MOS transistor 4a.

For example, the second control circuit 9h is constituted by a second NOR circuit 9j that receives the data signal "D" and the first mode switching signal "NV_R", performs an arithmetic operation thereon and outputs the result of the arithmetic operation to the gate of the fourth n-type MOS transistor 4b.

For example, in the read mode (when the first mode switching signal "NV_R" is "High"), the output signals of the first NOR circuit 9i and the second NOR circuit 9j are "Low". As a result, the gates are set at the "Low" level, and the third n-type MOS transistor 4a and the fourth n-type MOS transistor 4b are turned off. Thus, the parasitic capacitance produced by the third n-type MOS transistor 4a and the fourth n-type MOS transistor 4b decreases, and therefore, the parasitic capacitances of the first variable resistor element 2 and the second variable resistor element 3 are balanced. Thus, the difference between the effects of the parasitic capacitances of the first variable resistor element 2 and the second variable resistor element 3 on the currents flowing therethrough decreases.

Therefore, the retained data can be read by the SR flip flop 5 with higher reliability.

As described above, the semiconductor integrated circuit device according to this embodiment can be readily made to operate as a non-volatile flip flop with higher reliability.

Third Embodiment

In the second embodiment, there has been described a configuration in which the current supply circuits supply an additional current to make a current of a predetermined value or greater flow through the first and second variable resistor elements with higher reliability.

In a third embodiment, there will be described another configuration in which current supply circuits supply an additional current to make a current of a predetermined value or greater flow through a first variable resistor element and a second variable resistor element with higher reliability.

Figure 12:
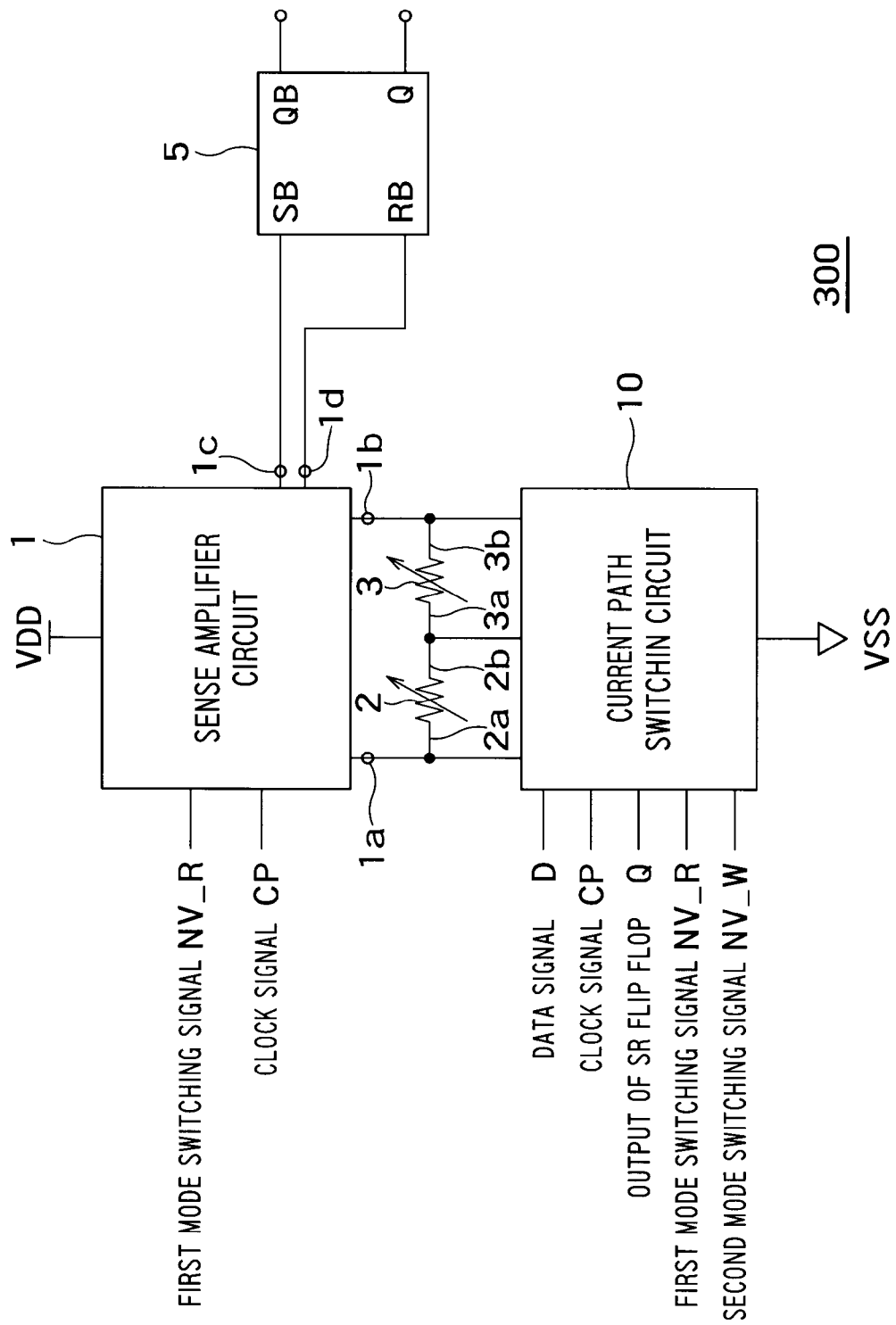
FIG. 12 is a diagram showing a configuration of essential parts of a semiconductor integrated circuit device 300 according to a third embodiment of the present invention.

FIG. 12 is a diagram showing a configuration of essential parts of a semiconductor integrated circuit device 300 according to the third embodiment of the present invention, which is an aspect of the present invention. In FIG. 12, the same reference numerals as those in FIG. 8 denote the same parts as those in the second embodiment.

As shown in FIG. 12, the semiconductor integrated circuit device 300 has a sense amplifier circuit 1, a first variable resistor element 2, a second variable resistor element 3, a current path switching circuit 10, and an SR flip flop 5. The parts other than the current path switching circuit 9 are the same as those in the first embodiment.

The current path switching circuit 10 has a first current path extending between a first write path terminal 4e and the ground (ground potential "VSS"), a second current path extending between a second write path terminal 4f and the ground (ground potential "VSS"), and a third current path extending between a point of connection of a second end 2b and a fourth end 3b and the ground (ground potential "VSS").

To the current path switching circuit 10, a data signal "D", a clock signal "CP", a first mode switching signal "NV_R", a second mode switching signal "NV_W", and a signal equivalent to a signal output from an output terminal "Q" of the SR flip flop are input. Signals equivalent to the signal output from the output terminal "Q" of the SR flip flop include a signal output from a logic circuit constituting the SR flip flop.

Figure 13:
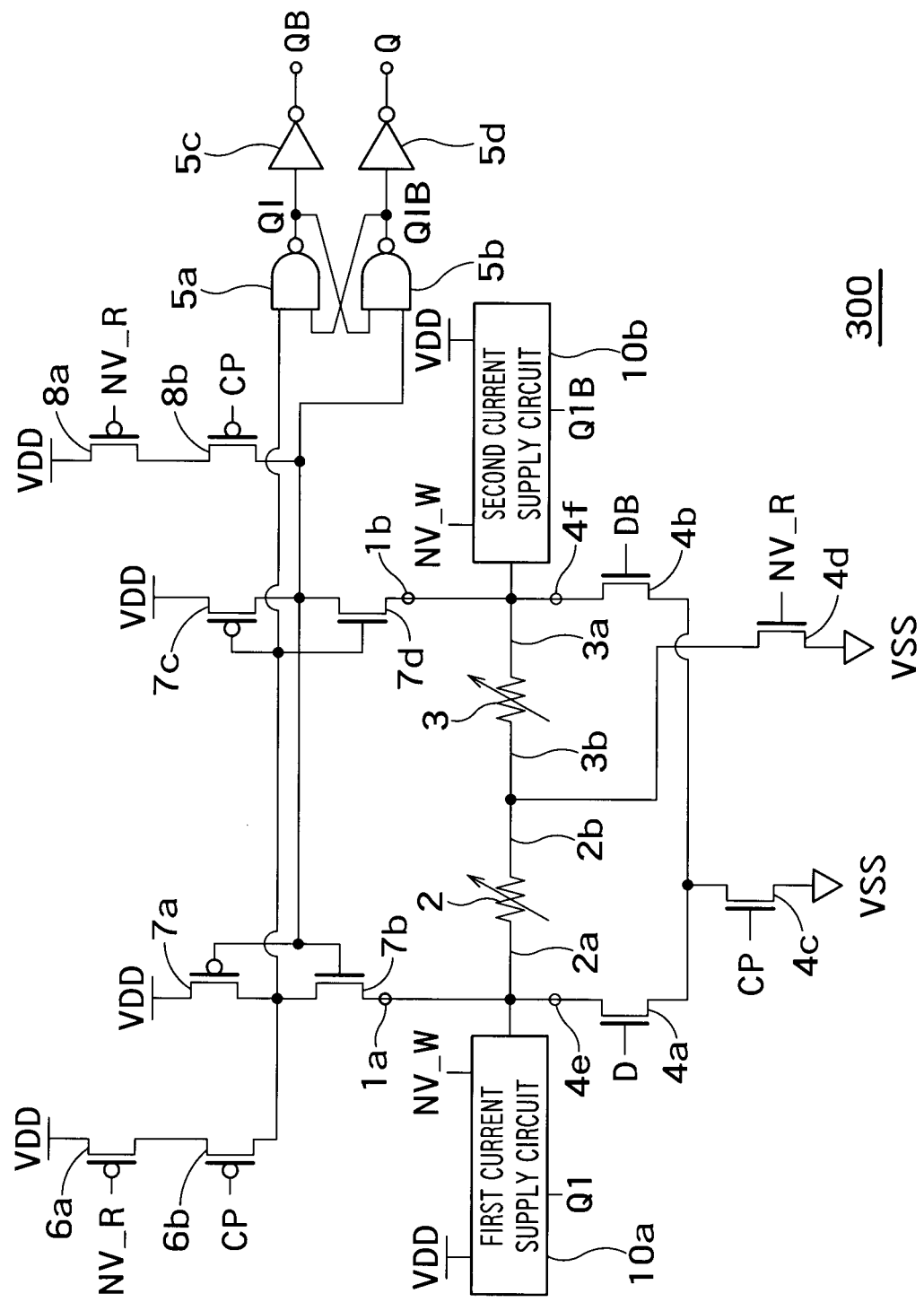
FIG. 13 is a diagram specifically showing the components of the semiconductor integrated circuit device shown in FIG. 12 including the current path switching circuit.

FIG. 13 is a diagram specifically showing the components of the semiconductor integrated circuit device shown in FIG. 12 including the current path switching circuit. In FIG. 13, the same reference numerals as those in FIG. 9 denote the same parts as those in the second embodiment.

As shown in FIG. 13, the current path switching circuit 10 described above has a third n-type MOS transistor 4a that is connected to a first end 2a of the first variable resistor element 2 at the drain thereof and receives the data signal "D" at the gate thereof, and a fourth n-type MOS transistor 4b that is connected to a third end 3a of the second variable resistor element 3 at the drain thereof and to the source of the third n-type MOS transistor 4a at the source thereof and receives a data signal "DB", which is the data signal "D" inverted, at the gate thereof.

The current path switching circuit 10 further has a fifth n-type MOS transistor 4c that is connected to the sources of the third n-type MOS transistor 4a and the fourth n-type MOS transistor 4b at the drain thereof and to the ground potential at the source thereof and receives the clock signal "CP" at the gate thereof, and a sixth n-type MOS transistor 4d that is connected to the second end 2b of the first variable resistor element 2 and the fourth end 3b of the second variable resistor element 3 at the drain thereof and to the ground potential at the source thereof and receives the first mode switching signal "NV_R" at the gate thereof.

That is, the first current path of the current path switching circuit 10 includes the third n-type MOS transistor 4a. The second current path of the current path switching circuit 10 includes the fourth n-type MOS transistor 4b.

The first and second current paths are blocked by the fifth n-type MOS transistor 4c according to the clock signal "CP". The third current path is blocked by the sixth n-type MOS transistor 4d according to the first mode switching signal "NV_R".

The current path switching circuit 10 further has a first current supply circuit 10a connected between a power supply "VDD" and the first end 2a, and a second current supply circuit 10b connected between the power supply "VDD" and the third end 3a.

Figure 14:
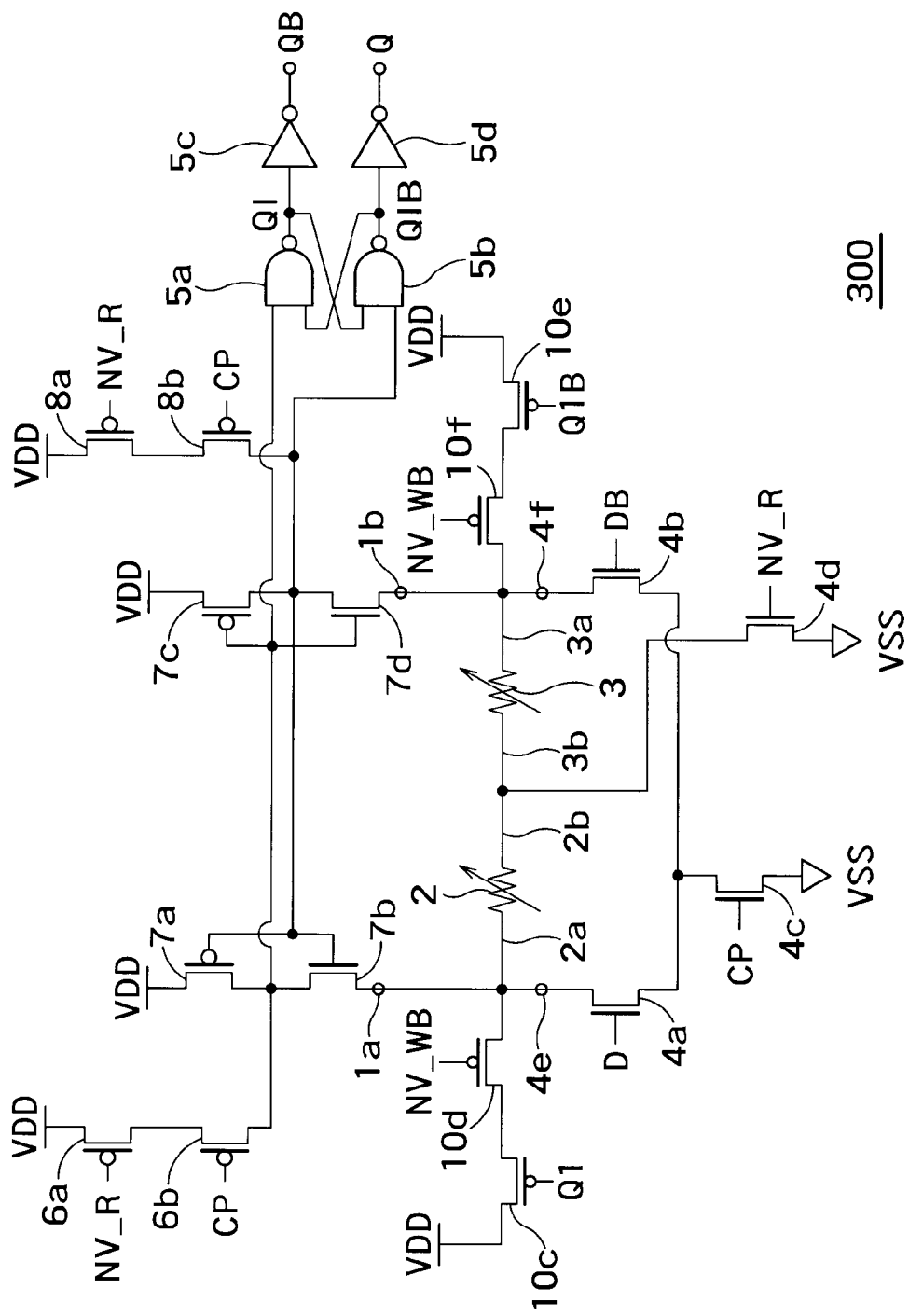
FIG. 14 is a diagram specifically showing the first and second current supply circuits of the semiconductor integrated circuit device shown in FIG. 13.

FIG. 14 is a diagram specifically showing the first and second current supply circuits of the semiconductor integrated circuit device shown in FIG. 13.

As shown in FIG. 14, the first current supply circuit 10a has a seventh p-type MOS transistor 10c that is connected to the power supply "VDD" at the source thereof and receives a signal (referred to as a signal "QI" herein) equivalent to a signal "QI" output from a first NAND circuit 5a, which is a logic circuit forming the SR flip flop 5, at the gate thereof, and an eighth p-type MOS transistor 10d that is connected to the drain of the seventh p-type MOS transistor 10c at the source thereof and to the first end 2a at the drain thereof and receives a signal "NV_WB" at the gate thereof. Signals equivalent to the signal "QI" include a signal output from the second output terminal "Q" (the same holds true for the following description).

The second current supply circuit 10b has a ninth p-type MOS transistor 10e that is connected to the power supply "VDD" at the source thereof and receives a signal (referred to as a signal "QIB" herein) equivalent to a signal "QIB", which is the signal "QI" inverted, at the gate thereof, and a tenth p-type MOS transistor 10f that is connected to the drain of the ninth p-type MOS transistor 10e at the source thereof and to the third end 3a at the drain thereof and receives the signal "NV_WB" at the gate thereof. Signals equivalent to the signal "QIB" include a signal output from a first output terminal "QB" (the same holds true for the following description).

Now, there will be described an operation of the semiconductor integrated circuit device 300 configured as described above to retain data in the first variable resistor element 2 and the second variable resistor element 3 with higher reliability in the normal operation mode.

The operation of the semiconductor integrated circuit device 300 at the time when the signal "NV_WB" is "High" (the second mode switching signal "NV_W" is "Low") in the normal operation mode is the same as the operation of the semiconductor integrated circuit device 100 according to the first embodiment shown in FIG. 5 in the normal operation mode. In other words, the semiconductor integrated circuit device operates as a D-type flip flop.

Thus, there will be described an operation in the case where the signal "NV_WB" is "Low" (the second mode switching signal "NV_W" is "High"). In this example, the clock signal "CP" is fixed at "High", and the first mode switching signal "NV_R" is fixed at "Low".

If the signal "NV_WB" is "Low", a current flows through the spin-injection variable resistor elements according to the signals "QI" and "QIB". For example, if the signal "QI" is "High", a current flows in the leftward direction. The amount and duration of the current can be controlled by adjusting the size of the eighth p-type MOS transistor 10d and the tenth p-type MOS transistor 10f and the time in which the signal "NV_WB" is kept at "Low". At this time, as in the first embodiment described above, the first variable resistor element 2 has a lower resistance, and the second variable resistor element 3 has a higher resistance.

Then, the power supply "VDD" is turned off and then turned on again. After that, in the state where the signal "NV_WB" is "High" (the second mode switching signal "NV_W" is "Low"), as in the first embodiment, data based on the relationship between the magnitudes of the resistances of the first variable resistor element 2 and the second variable resistor element 3 is read into the SR flip flop 5.

In this way, in the normal operation mode, the first current supply circuit 10a and the second current supply circuit 10b supply a current to the first variable resistor element 2 and the second variable resistor element 3 so that a current of a predetermined value or greater flows through the first variable resistor element 2 and the second variable resistor element 3 according to the second mode switching signal "NV_W" and the signals "QI" and "QIB" equivalent to the output signals of logic circuits forming the SR flip flop 5.

In this way, a current of a predetermined value or greater can be flowed through the first variable resistor element 2 and the second variable resistor element 3 with higher reliability. Therefore, data recording in the first variable resistor element 2 and the second variable resistor element 3 based on the relationship between the magnitudes of the resistances can be achieved with higher reliability.

Figure 15:
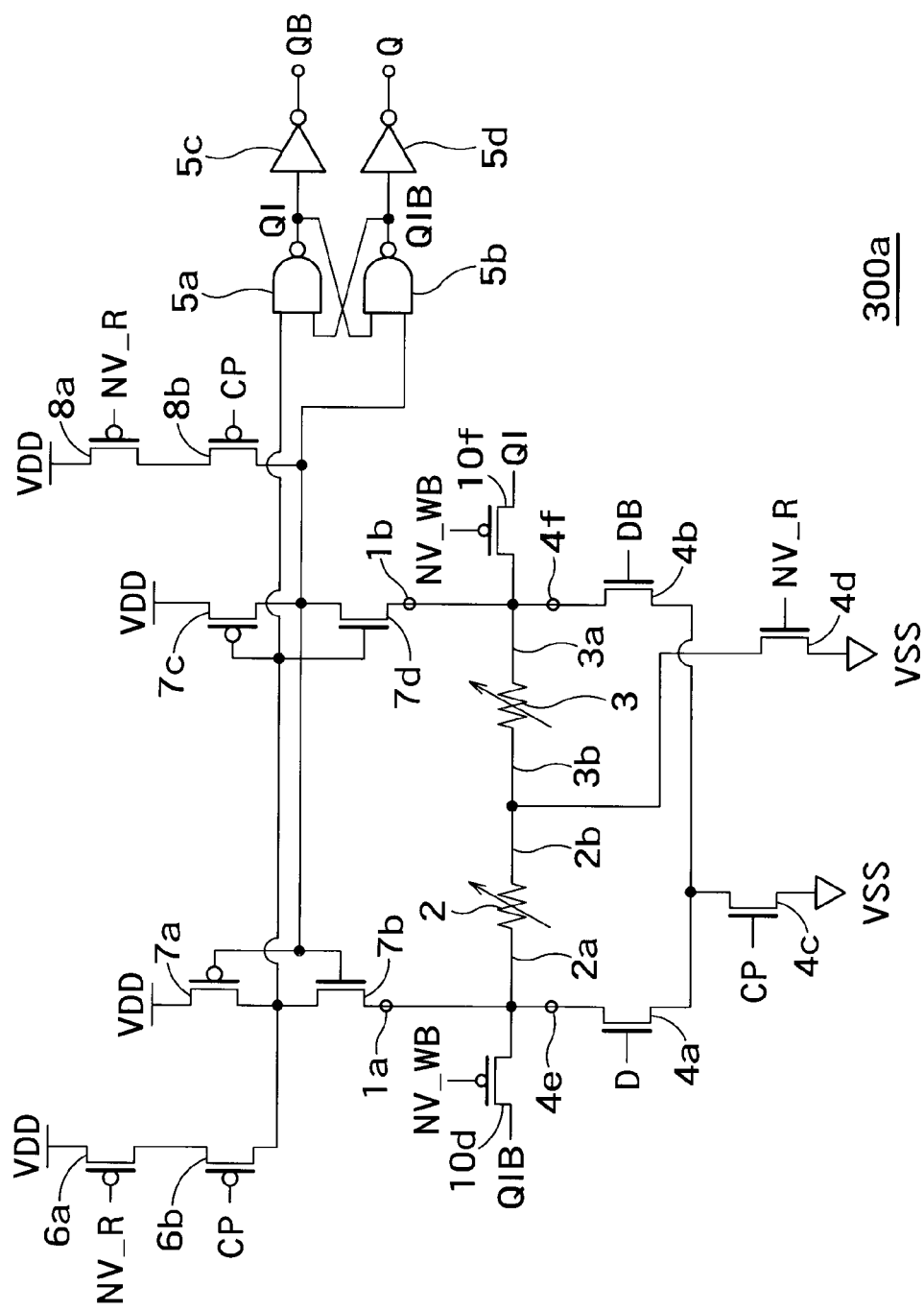
FIG. 15 is a diagram specifically showing another example of the first and second current supply circuits of the semiconductor integrated circuit device shown in FIG. 13.

FIG. 15 is a diagram specifically showing another example of the first and second current supply circuits of the semiconductor integrated circuit device shown in FIG. 13.

As shown in FIG. 15, a first current supply circuit 10a has an eighth p-type MOS transistor 10d that receives a current based on a signal "QIB" at the source thereof, is connected to a first end 2a at the drain thereof and receives a signal "NV_WB" at the gate thereof.

A second current supply circuit 10b has a tenth p-type MOS transistor 10f that is connected to the power supply "VDD" and receives a current based on a signal "QI" at the source thereof, is connected to the third end 3a at the drain thereof and receives the signal "NV_WB" at the gate thereof.

A semiconductor integrated circuit device 300a operates in the same manner as the semiconductor integrated circuit device 300 shown in FIG. 14, because the eighth p-type MOS transistor 10d and the tenth p-type MOS transistor 10f are controlled by the signal "NV_WB".

In the semiconductor integrated circuit device 300a, the currents based on the signals "QI" and "QIB" flow through the first variable resistor element 2 and the second variable resistor element 3.

For the semiconductor integrated circuit device 300a, for example, the number of transistors can be reduced, while the load capacitance of the signals "QI" and "QIB" output from the first NAND circuit 5a and the second NAND circuit 5b increases.

Now, as in the second embodiment, there will be described a modification of the semiconductor integrated circuit device 300 configured for reducing the parasitic capacitance of produced by the third n-type MOS transistor 4a and the fourth n-type MOS transistor 4b.

Figure 16:
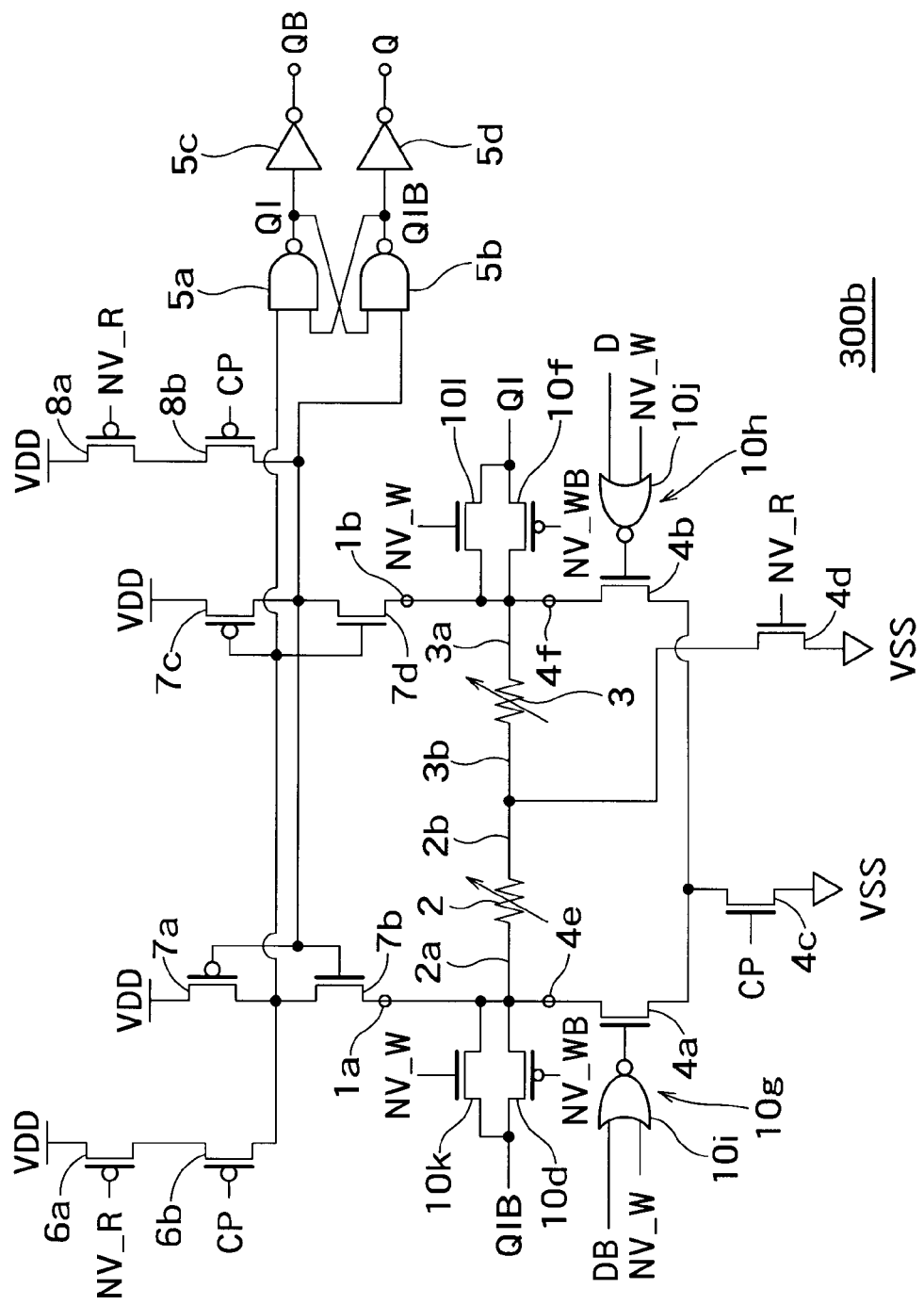
FIG. 16 is a diagram showing a modification of the semiconductor integrated circuit device shown in FIG. 15.

FIG. 16 is a diagram showing a modification of the semiconductor integrated circuit device shown in FIG. 15.

As shown in FIG. 16, in a semiconductor integrated circuit device 300b, the current path switching circuit 10 further has a first control circuit 10g that turns off the third n-type MOS transistor 4a in the read mode, and a second control circuit 10h that turns off the fourth n-type MOS transistor 4b in the read mode.

For example, the first control circuit 10g is constituted by a first NOR circuit 10i that receives the data signal "DB" and the first mode switching signal "NV_R", performs an arithmetic operation thereon and outputs the result of the arithmetic operation to the gate of the third n-type MOS transistor 4a.

For example, the second control circuit 10h is constituted by a second NOR circuit 10j that receives the data signal "D" and the first mode switching signal "NV_R", performs an arithmetic operation thereon and outputs the result of the arithmetic operation to the gate of the fourth n-type MOS transistor 4b.

For example, in the read mode (when the first mode switching signal "NV_R" is "High"), the output signals of the first NOR circuit 10i and the second NOR circuit 10j are "Low". As a result, the gates are set at the "Low" level, and the third n-type MOS transistor 4a and the fourth n-type MOS transistor 4b are turned off. Thus, the capacitance produced by the third n-type MOS transistor 4a and the fourth n-type MOS transistor 4b is eliminated, and therefore, the parasitic capacitances of the first variable resistor element 2 and the second variable resistor element 3 become equal. Thus, the difference between the effects of the parasitic capacitances of the first variable resistor element 2 and the second variable resistor element 3 on the currents flowing therethrough decreases.

Therefore, the retained data can be read by the SR flip flop 5 with higher reliability.

Furthermore, the first current supply circuit 10a has an eighth p-type MOS transistor 10d that receives a current based on the signal "QIB" at the source thereof, is connected to the first end 2a at the drain thereof and receives the signal "NV_WB" at the gate thereof, and a ninth n-type MOS transistor 10k that receives a current based on the signal "QIB" at the drain thereof, is connected to the first end 2a at the source thereof and receives the second mode switching signal "NV_WB" at the gate thereof.

Furthermore, the second current supply circuit 10b has a tenth p-type MOS transistor 10f that is connected to the power supply "VDD" and receives a current based on the signal "QI" at the source thereof, is connected to the third end 3a at the drain thereof and receives the signal "NV_WB" at the gate thereof, and a tenth n-type MOS transistor 10l that receives a current based on the signal "QI" at the drain thereof, is connected to the third end 3a at the source thereof and receives the second mode switching signal "NV_W" at the gate thereof.

In this way, the first current supply circuit 10a and the second current supply circuit 10b use two MOS transistors to supply currents based on the signals "QI" and "QIB" to the first variable resistor element 2 and the second variable resistor element 3. Thus, the currents based on the signals "QI" and "QIB" can be supplied to the first variable resistor element 2 and the second variable resistor element 3 with higher reliability that in the case shown in FIG. 15.

Furthermore, even if the values of the data signals "D" and "DB" vary during operation, a predetermined current can be supplied to the first variable resistor element 2 and the second variable resistor element 3 as far as the values of the signals "QI" and "QIB" are equal to or greater than a predetermined value.

As described above, the semiconductor integrated circuit device according to this embodiment can be readily made to operate as a non-volatile flip flop with higher reliability.

Fourth Embodiment

In the embodiments 2 and 3, there has been described configurations in which current supply circuits supply an additional current to make a current of a predetermined value or greater flow through the first and second variable resistor elements with higher reliability.

In a fourth Embodiment, there will be described a configuration in which a current path switching circuit ensures that a current of a predetermined value flows through first and second variable resistor elements with higher reliability even if a data input signal varies during writing.

Figure 17:
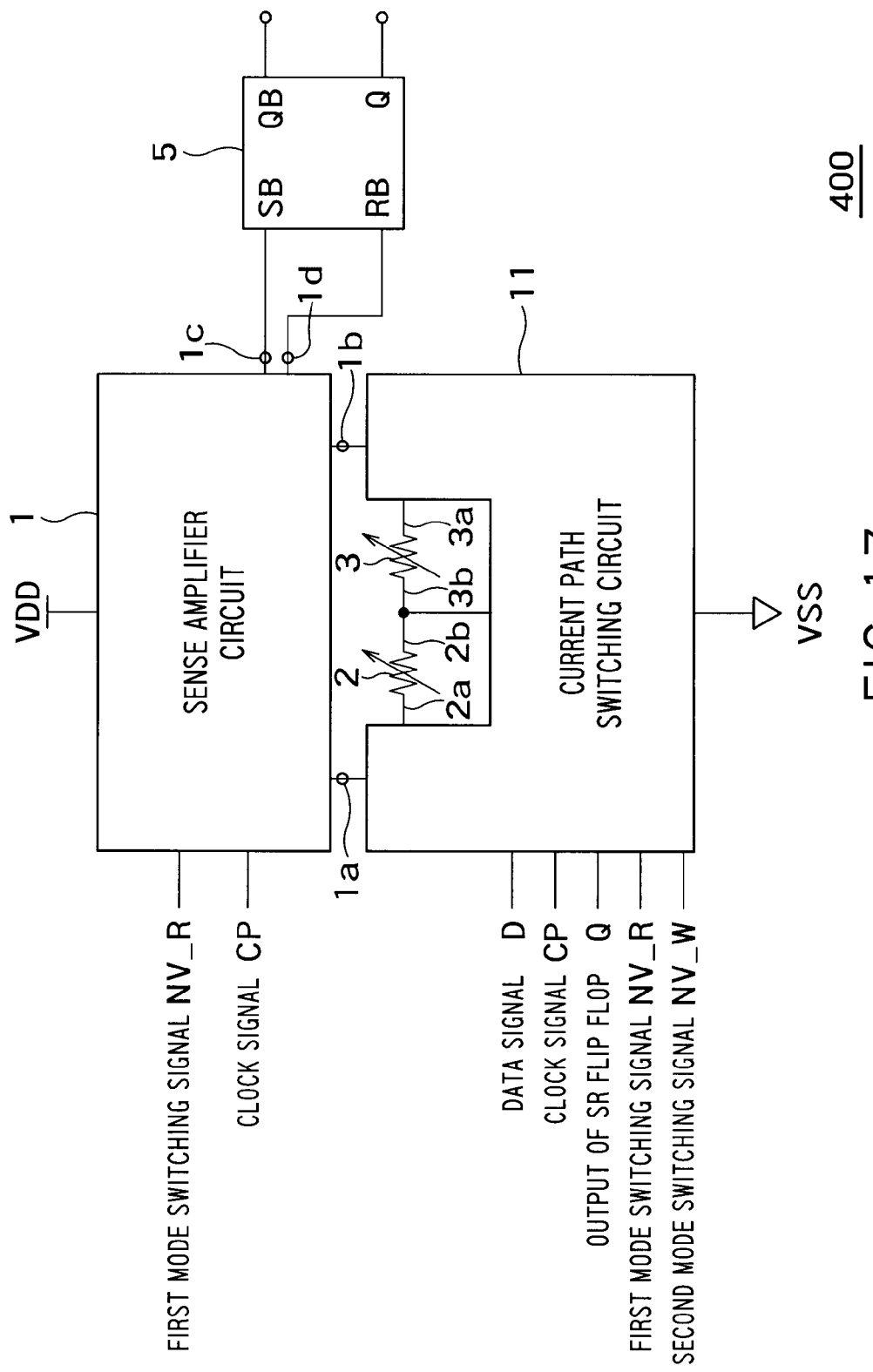
FIG. 17 is a diagram showing a configuration of essential parts of a semiconductor integrated circuit device according to the fourth Embodiment of the present invention.

FIG. 17 is a diagram showing a configuration of essential parts of a semiconductor integrated circuit device according to the fourth Embodiment of the present invention, which is an aspect of the present invention. In FIG. 17, the same reference numerals as those in FIG. 12 denote the same parts as those in the third embodiment.

As shown in FIG. 17, a semiconductor integrated circuit device 400 has a sense amplifier circuit 1, a first variable resistor element 2, a second variable resistor element 3, a current path switching circuit 11, and an SR flip flop 5. The parts other than the current path switching circuit 11 are the same as those in the first embodiment.

The current path switching circuit 11 has a first current path extending between a first write path terminal 4e and the ground (ground potential "VSS"), a second current path extending between a second write path terminal 4f and the ground (ground potential "VSS"), and a third current path extending between a point of connection of a second end 2b and a fourth end 3b and the ground (ground potential "VSS"). To the current path switching circuit 11, a data signal "D", a clock signal "CP", a first mode switching signal "NV_R", a second mode switching signal "NV_W", and a signal equivalent to a signal output from an output terminal "Q" of the SR flip flop are input.

Figure 18:
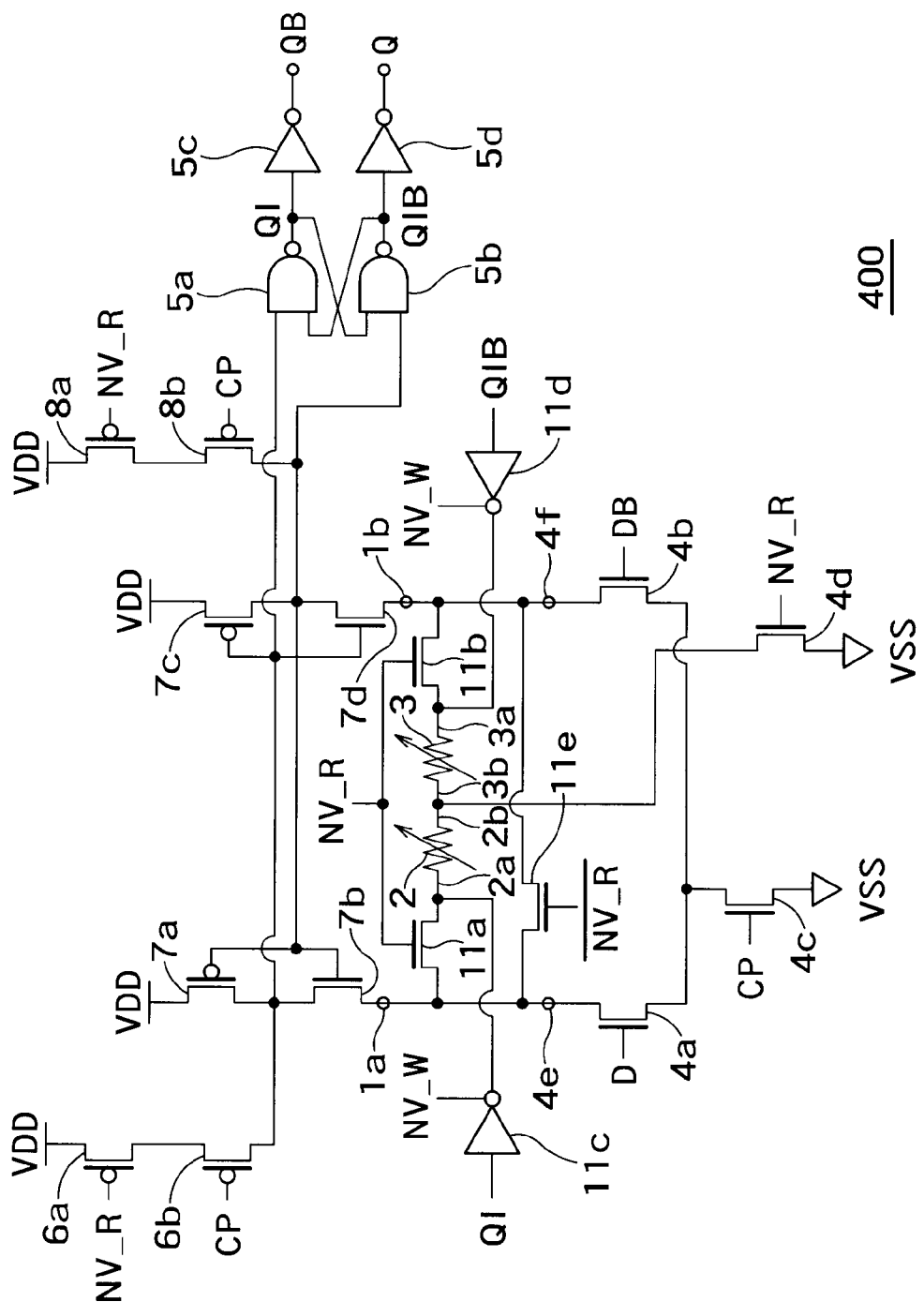
FIG. 18 is a diagram specifically showing the components of the semiconductor integrated circuit device shown in FIG. 17 including the current path switching circuit.

FIG. 18 is a diagram specifically showing the components of the semiconductor integrated circuit device shown in FIG. 17 including the current path switching circuit. In FIG. 18, the same reference numerals as those in FIG. 5 denote the same parts as those in the first embodiment.

As shown in FIG. 18, in addition to the same components as those of the current path switching circuit 4 shown in FIG. 5, the current path switching circuit 11 described above has an eleventh n-type MOS transistor 11a that is connected to a first current supply terminal 1a at the drain thereof and to a first end 2a at the source thereof and receives the first mode switching signal "NV_R" at the gate thereof, and a twelfth n-type MOS transistor 11b that is connected to a second current supply terminal 1b at the drain thereof and to a third end 3a at the source thereof and receives the first mode switching signal "NV_R" at the gate thereof.

In addition to the same components as those of the current path switching circuit 4 shown in FIG. 5, the current path switching circuit 11 described above further has a first clocked inverter 11c that receives a signal "QI", is connected to the first end 2a at the output thereof, and is controlled by the first mode switching signal "NV_R", a second clocked inverter 11d that receives a signal "QIB", is connected to the first end 2a at the output thereof and is controlled by the first mode switching signal "NV_R", and a thirteenth n-type MOS transistor 11e that is connected to the second current supply terminal 1b at the source thereof and receives the first mode switching signal "NV_R" at the gate thereof.

Now, there will be described an operation of the semiconductor integrated circuit device 400 configured as described above to retain data in the first variable resistor element 2 and the second variable resistor element 3 with higher reliability in the normal operation mode.

Figure 19:
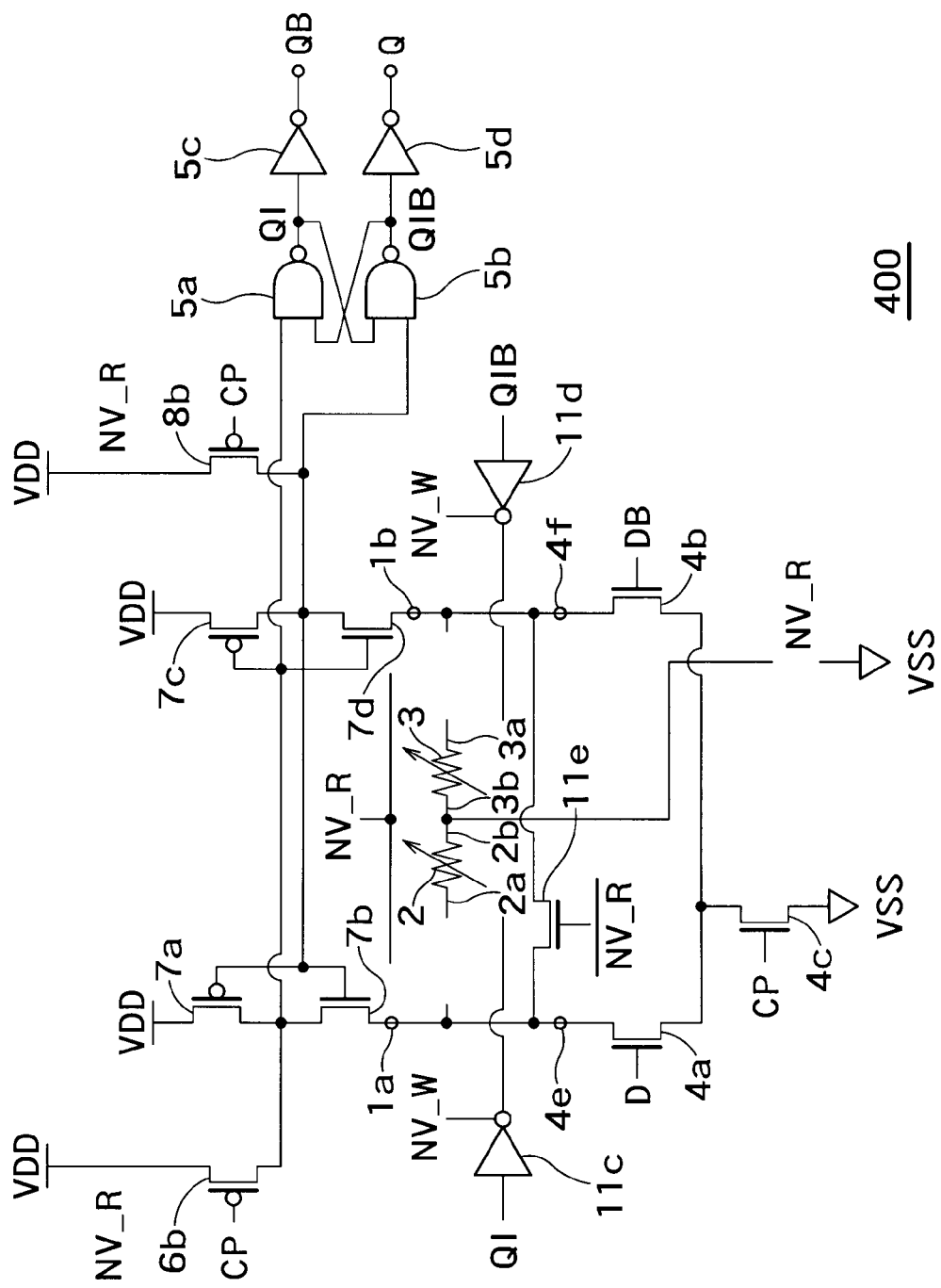
FIG. 19 is a diagram for illustrating a case where the semiconductor integrated circuit device shown in FIG. 18 is in the normal operation mode (where the input first mode switching signal "NV_R" is "Low", and the second mode switching signal "NV_W" is "Low")

FIG. 19 is a diagram for illustrating a case where the semiconductor integrated circuit device shown in FIG. 18 is in the normal operation mode (where the input first mode switching signal "NV_R" is "Low", and the second mode switching signal "NV_W" is "Low").

As shown in FIG. 19, the operation of the semiconductor integrated circuit device 400 at the time when the input first mode switching signal "NV_R" is "Low", and the second mode switching signal "NV_W" is "Low" in the normal operation mode is the same as the operation of the semiconductor integrated circuit device 100 according to the first embodiment shown in FIG. 5 in the normal operation mode. In other words, the semiconductor integrated circuit device operates as a D-type flip flop.

Now, there will be described an operation of the semiconductor integrated circuit device 400 to write data in the first variable resistor element 2 and the second variable resistor element 3 in the normal operation mode.

Figure 20:
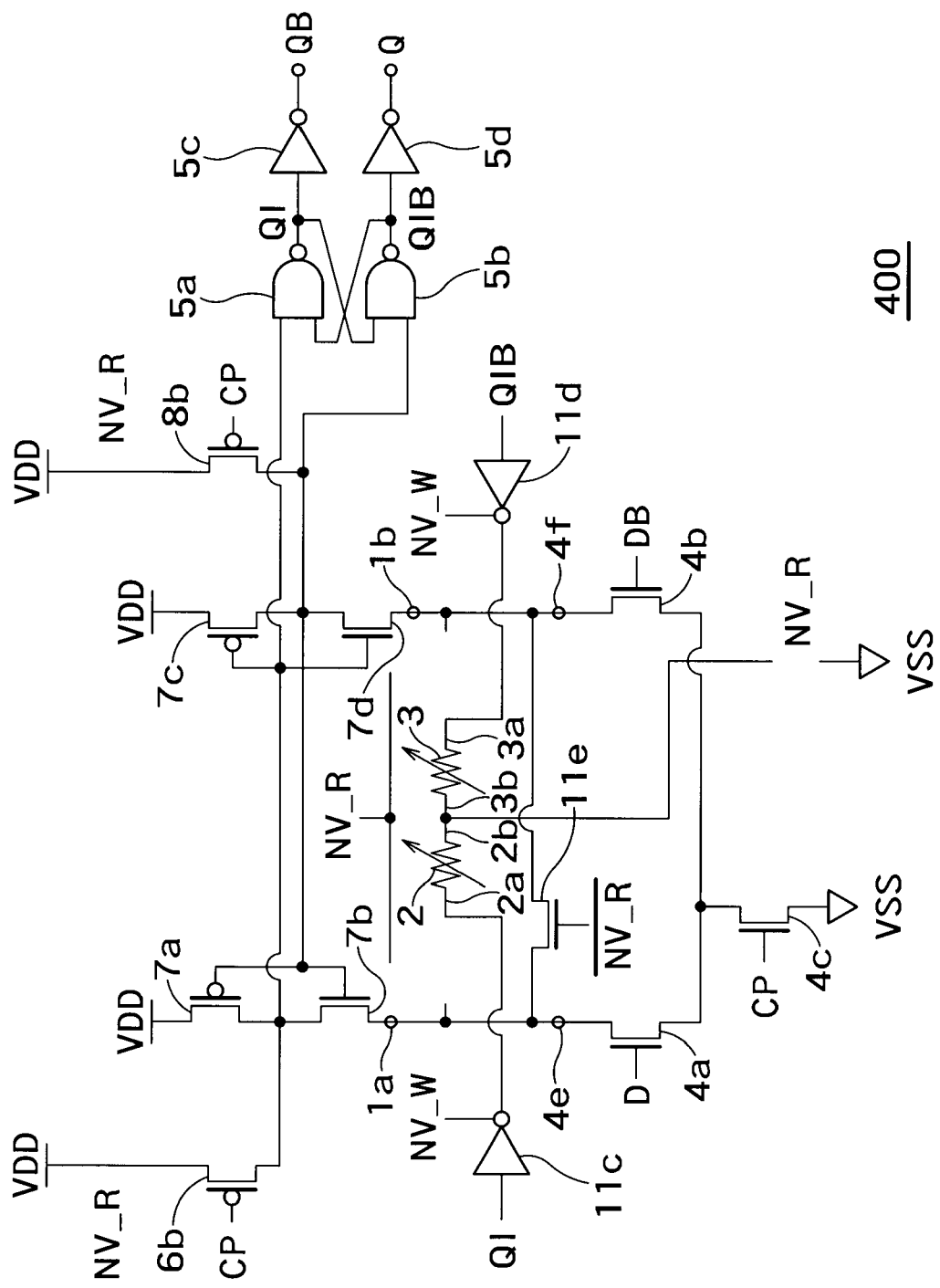
FIG. 20 is a diagram for illustrating an operation of the semiconductor integrated circuit device shown in FIG. 18 to write data in the first variable resistor element and the second variable resistor element.

FIG. 20 is a diagram for illustrating an operation of the semiconductor integrated circuit device shown in FIG. 18 to write data in the first variable resistor element 2 and the second variable resistor element 3. In FIG. 20, the first mode switching signal "NV_R" is "Low", and the second mode switching signal "NV_W" is "High".

In this state, a current of a predetermined value or greater is made to flow through the variable resistor elements in the leftward or rightward direction according to the values of the currents based on the signals "QI" and "QIB", thereby increasing or decreasing the resistances of the first variable resistor element 2 and the second variable resistor element 3.

Then, the power supply "VDD" is turned off and then turned on again. After that, the semiconductor integrated circuit device 400 reads data retained in the first variable resistor element 2 and the second variable resistor element 3 into the SER flip flop.

Figure 21:
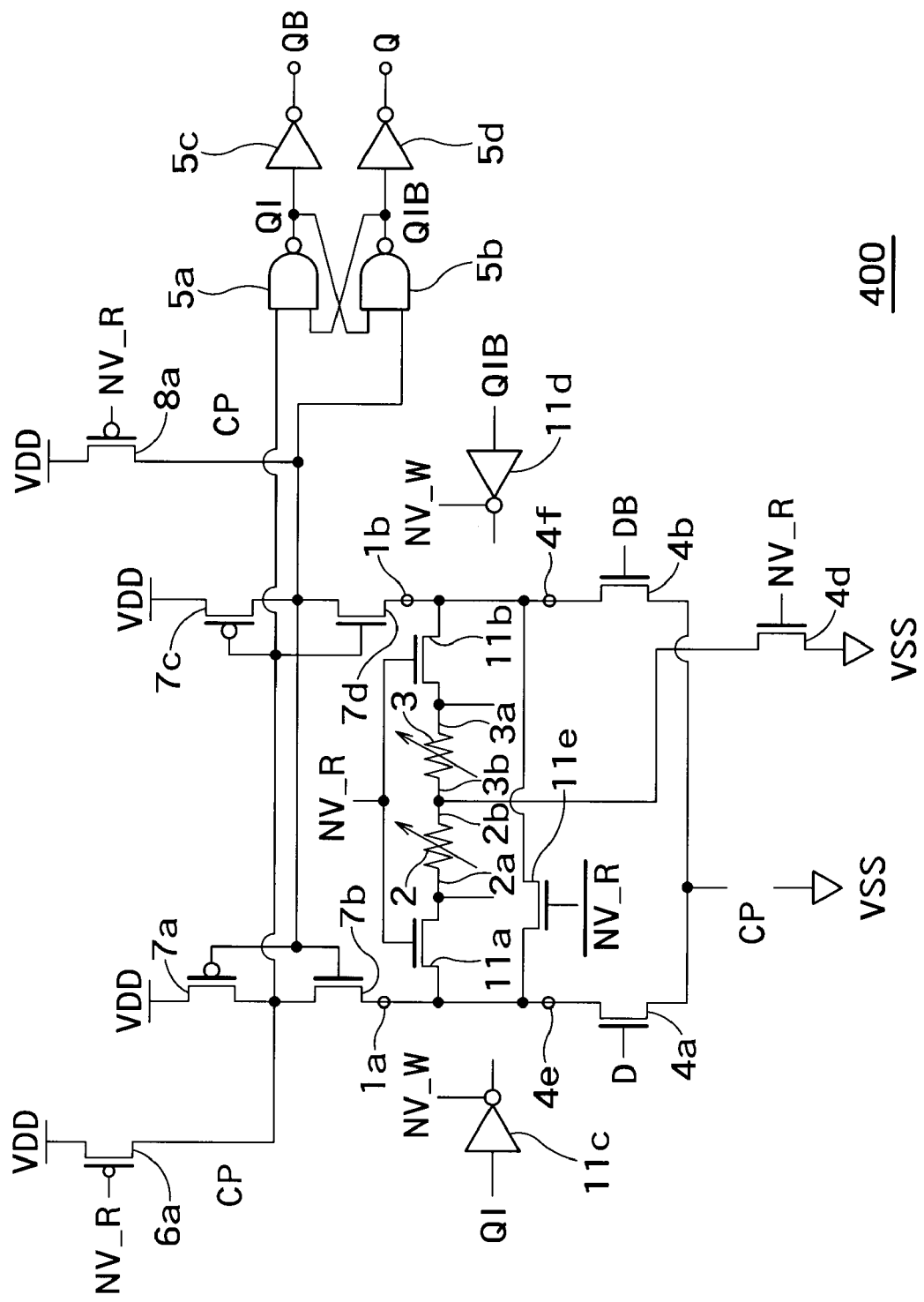
FIG. 21 is a diagram for illustrating an operation of the semiconductor integrated circuit device shown in FIG. 18 to read data retained in the first variable resistor element and the second variable resistor element into the SR flip flop.

FIG. 21 is a diagram for illustrating an operation of the semiconductor integrated circuit device shown in FIG. 18 to read data retained in the first variable resistor element 2 and the second variable resistor element 3 into the SR flip flop. In FIG. 21, the second mode switching signal "NV_W" is fixed at "Low", and the clock signal "CP" is fixed at "Low".

If the first mode switching signal "NV_R" changes from "Low" to "High", as in the first embodiment, the semiconductor integrated circuit device 400 reads data based on the relationship between the magnitudes of the resistances of the first variable resistor element 2 and the second variable resistor element 3 into the SR flip flop 5.

In this way, in the normal operation mode, the current path switching circuit 11 supplies a current to the first variable resistor element 2 and the second variable resistor element 3 so that a current of a predetermined value or greater flows through the first variable resistor element 2 and the second variable resistor element 3 according to the first mode switching signal "NV_R", the second mode switching signal "NV_W" and the signals "QI" and "QIB".

In this way, a current of a predetermined value or greater can be flowed through the first variable resistor element 2 and the second variable resistor element 3 with higher reliability. Therefore, data recording in the first variable resistor element 2 and the second variable resistor element 3 based on the relationship between the magnitudes of the resistances can be achieved with higher reliability.

Then, the first mode switching signal "NV_R" is changed from "High" to "Low", thereby restoring the clock signal "CP" fixed in the "Low" state to the normal variable state. As a result, the semiconductor integrated circuit device 400 returns to the normal operation mode described above and operates as a D-type flip flop as in the first embodiment.

As described above, the semiconductor integrated circuit device according to this embodiment can be readily made to operate as a non-volatile flip flop with higher reliability.

In the embodiments described above, the resistance of the first variable resistor element increases when a current of a predetermined value or greater flows therethrough from the first end to the opposite second end and decreases when a current of a predetermined value or greater flows therethrough from the second end to the first end. Furthermore, the resistance of the second variable resistor element increases when a current of a predetermined value or greater flows therethrough from the third end to the fourth end and decreases when a current of a predetermined value or greater flows therethrough from the fourth end to the third end.

However, even if the relationship between the direction of the current flowing through the first and second variable resistor elements and the variation of the resistances thereof is reversed, the same advantages as those of the embodiments described above can be achieved by inserting an inverter or appropriately reversing the logical configuration of each circuit component.

Furthermore, even if the logic of the first mode switching signal "NV_R", the second mode switching signal "NV_W", the clock signal "CP" and the data signal "D" is reversed, the same advantages as those of the embodiments described above can be achieved by inserting an inverter or appropriately reversing the logical configuration of each circuit component.

What is claimed is:

1. A semiconductor integrated circuit device, comprising:
 a first variable resistor element and a second variable resistor element whose resistances are changed complementarily depending on a current; and
 a current path switching circuit that supplies said current from a power supply by switching between current paths according to whether a normal operation mode or a read mode is input externally,
 wherein said power supply is turned off and then turned on again in said normal operation mode, and in this state, data corresponding to the relationship between the magnitudes of the resistances of said first variable resistor element and said second variable resistor element is read in said read mode.

2. A semiconductor integrated circuit device, comprising:
a sense amplifier circuit that is connected to a power supply, outputs currents from a first current supply terminal and a second current supply terminal, and outputs a first sense signal from a first signal terminal and a second sense signal, which is equivalent to said first sense signal inverted, from a second signal terminal according to a voltage drop due to output of the currents;
a first variable resistor element that is connected to said first current supply terminal of said sense amplifier circuit at a first end, which is one end thereof, and has a resistance that increases when a current of a predetermined value or greater flows in a first direction between said first end and a second end, which is the other end thereof, and decreases when a current of a predetermined value or greater flows in a second direction, which is opposite to said first direction, between said first end and said second end;
a second variable resistor element that is connected to said second current supply terminal of said sense amplifier circuit at a third end, which is one end thereof, and to the second end of said first variable resistor element at a fourth end, which is the other end thereof, and has a resistance that increases when a current of a predetermined value or greater flows in said second between said third end and said fourth end and decreases when a current of a predetermined value or greater flows in said first direction between said third end and said fourth end;
a current path switching circuit that has a first current path extending between a first write path terminal connected to said first end and the ground, a second current path extending between a second write path terminal connected to said third end and said ground, and a third current path extending between a point of connection of said second end and said fourth end and said ground; and
an SR flip flop that is connected to said first signal terminal at a first input terminal and to said second signal terminal at a second input terminal and outputs a first output signal from a first output terminal and a second output signal, which is equivalent to said first output signal inverted, from a second output terminal according to the state of the first sense signal and the second sense signal input thereto,
wherein said current path switching circuit
blocks said third current path and limits one of the current flowing through said first current path and the current flowing through said second current path according to a data signal in a normal operation mode, and
blocks said first current path and said second current path and makes said third current path conductive in a read mode, in which data corresponding to the relationship between the magnitudes of the resistances of said first variable resistor element and said second variable resistor element is read after said power supply is turned off and then turned on again in said normal operation mode.

3. The semiconductor integrated circuit device according to claim 2, wherein said first current path includes a first MOS transistor that limits a current under the control of said data signal,
said second current path includes a second MOS transistor that limits a current under the control of said data signal, and said current path switching circuit has a control circuit that turns off said first MOS transistor and said second MOS transistor in said read mode.

4. The semiconductor integrated circuit device according to claim 2, further comprising:
a first current supply circuit and a second current supply circuit that supply currents to said first variable resistor element and said second variable resistor element, respectively, so that a current of a predetermined value or greater flows through said first variable resistor element and said second variable resistor element in said normal operation mode.

5. The semiconductor integrated circuit device according to claim 3, further comprising:
a first current supply circuit and a second current supply circuit that supply currents to said first variable resistor element and said second variable resistor element, respectively, so that a current of a predetermined value or greater flows through said first variable resistor element and said second variable resistor element in said normal operation mode.

6. The semiconductor integrated circuit device according to claim 4, wherein said first current supply circuit and said second current supply circuit supply said currents to said first variable resistor element and said second variable resistor element according to said data signal or a signal output from a logic circuit forming said SR flip flop.

7. The semiconductor integrated circuit device according to claim 5, wherein said first current supply circuit and said second current supply circuit supply said currents to said first variable resistor element and said second variable resistor element according to said data signal or a signal output from a logic circuit forming said SR flip flop.

8. The semiconductor integrated circuit device according to claim 4, wherein said first current supply circuit supplies a current based on a signal equivalent to said first output signal of said SR flip flop to said first variable resistor element, and
said second current supply circuit supplies a current based on a signal equivalent to said second output signal of said SR flip flop to said second variable resistor element.

9. The semiconductor integrated circuit device according to claim 5, wherein said first current supply circuit supplies a current based on a signal equivalent to said first output signal of said SR flip flop to said first variable resistor element, and
said second current supply circuit supplies a current based on a signal equivalent to said second output signal of said SR flip flop to said second variable resistor element.

10. The semiconductor integrated circuit device according to claim 6, wherein said first current supply circuit supplies a current based on a signal equivalent to said first output signal of said SR flip flop to said first variable resistor element, and
said second current supply circuit supplies a current based on a signal equivalent to said second output signal of said SR flip flop to said second variable resistor element.

11. The semiconductor integrated circuit device according to claim 7, wherein said first current supply circuit supplies a current based on a signal equivalent to said first output signal of said SR flip flop to said first variable resistor element, and
said second current supply circuit supplies a current based on a signal equivalent to said second output signal of said SR flip flop to said second variable resistor element.

12. A semiconductor integrated circuit device, comprising:
a first variable resistor element that has a resistance that increases when a current of a predetermined value or greater flows in a first direction and decreases when a current of a predetermined value or greater flows in a second direction, which is opposite to said first direction;

a second variable resistor element that has a resistance that increases when a current of a predetermined value or greater flows in said second direction and decreases when a current of a predetermined value or greater flows in said first; and a current path switching circuit that supplies said current to said first variable resistor element and said second variable resistor element from a power supply by switching between current paths connected to said first variable resistor element and said second variable resistor element according to whether a normal operation mode or a read mode, wherein said power supply is turned off and then turned on again in said normal operation mode, and in this state, data corresponding to the relationship between the magnitudes of the resistances of said first variable resistor element and said second variable resistor element is read in said read mode.

* * * * *